US010782320B2

(12) United States Patent
Götz et al.

(10) Patent No.: US 10,782,320 B2
(45) Date of Patent: Sep. 22, 2020

(54) METHOD AND SENSOR FOR MEASURING AN ALTERNATING CURRENT

(71) Applicant: Dr. Ing. h.c. F. Porsche Aktiengesellschaft, Stuttgart (DE)

(72) Inventors: Stefan Götz, Forstern (DE); Hermann Dibos, Remchingen (DE); Rafael Banzhaf, Gerstetten (DE)

(73) Assignee: Dr. Ing. h.c. F. Porsche Aktiengesellschaft (DE)

(*) Notice: Subject to any disclaimer, the term of this patent is extended or adjusted under 35 U.S.C. 154(b) by 375 days.

(21) Appl. No.: 15/837,432

(22) Filed: Dec. 11, 2017

(65) Prior Publication Data

US 2018/0164345 A1    Jun. 14, 2018

(30) Foreign Application Priority Data

Dec. 13, 2016 (DE) .................. 10 2016 124 165

(51) Int. Cl.
*G01R 15/18* (2006.01)
*G01R 19/25* (2006.01)
*G01R 19/00* (2006.01)

(52) U.S. Cl.
CPC ....... *G01R 15/181* (2013.01); *G01R 19/0092* (2013.01); *G01R 19/2506* (2013.01)

(58) Field of Classification Search
CPC .............. G01R 15/181; G01R 19/0092; G01R 19/2506; G01R 19/12
See application file for complete search history.

(56) References Cited

U.S. PATENT DOCUMENTS

| 8,710,824 B2* | 4/2014 | Ibuki | G01R 15/142 |
| | | | 324/126 |
| 2006/0220774 A1* | 10/2006 | Skendzic | G01R 15/181 |
| | | | 336/200 |
| 2008/0106253 A1 | 5/2008 | Kojovic | |
| 2008/0303511 A1* | 12/2008 | Grno | G01R 15/181 |
| | | | 324/117 R |

(Continued)

FOREIGN PATENT DOCUMENTS

WO    2014060106 A1    4/2014

OTHER PUBLICATIONS

Metwally, "Self-Integrating Rogowski Coil for High-Impulse Current Measurement" IEEE Transactions on Instrumentation and Measurement, v 59, No. 2, Feb. 2010 (Year: 2010).*

(Continued)

*Primary Examiner* — Lee E Rodak
(74) *Attorney, Agent, or Firm* — RatnerPrestia

(57) ABSTRACT

A method for measuring a temporal drainage of an alternating current flowing through a measurement object, in which a Rogowski-Steinhaus-Chattock coil is aligned on the measurement object, at least one isolating line is inserted into coil windings of the Rogowski-Steinhaus-Chattock coil, said isolating line minimizing a capacitive coupling of the coil windings of the Rogowski-Steinhaus-Chattock coil with one another and/or with at least one further electrical line, and a voltage induced by the alternating current in at least one measuring line comprising the Rogowski-Steinhaus-Chattock coil is measured. A corresponding sensor and a method for providing a sensor of this type are furthermore disclosed.

22 Claims, 16 Drawing Sheets

(56) References Cited

U.S. PATENT DOCUMENTS

| | | | |
|---|---|---|---|
| 2010/0109643 A1 | 5/2010 | Storkey | |
| 2011/0089933 A1 | 4/2011 | Javora et al. | |
| 2013/0063129 A1 | 3/2013 | Chamarti et al. | |
| 2015/0028852 A1 | 1/2015 | Pascal et al. | |
| 2016/0327592 A1* | 11/2016 | Hewson | G01R 15/181 |

OTHER PUBLICATIONS

Mariscotti et al. "A rogowski coil for high voltage applications," International Instrumentation and Measurement Technology Conference, May 2008 (Year: 2008).*

Samimi et al. "The Rogowski Coil Principles and Applications: A Review," IEEE Sensors Journal, V. 15, No. 2, Feb. 2015 (Year: 2015).*

Chattock, "On a Magnetic Potentiometer", Proceedings of the Physical Society of London, 1887, pp. 23-26.

Rogowski et al., "The Measurement of Magnetic Voltage (Measurement of the Line (Integral of Magnetic Field Strength)", Electrotechnology Archive, vol. 1, Edition 4, 1912 with translation, 17 pages.

Hain et al., "Highly Dynamic Current Measurements with Inductive Current Sensors—a Numerical Recipe", PCIM Europe, 2014, pp. 1617-1624.

Chinese Office Action for Chinese Application No. 201711306137.X, dated Oct. 28, 2019, 6 pages.

"The Rogowski Coil Principles and Applications: A Review", IEEE Sensors Journal., vol. 15, No. 2, Feb. 2015.

German Search Report for German Application No. 10 2016 124 165.2, dated Sep. 8, 2017, with partial English translation—11 Pages.

* cited by examiner

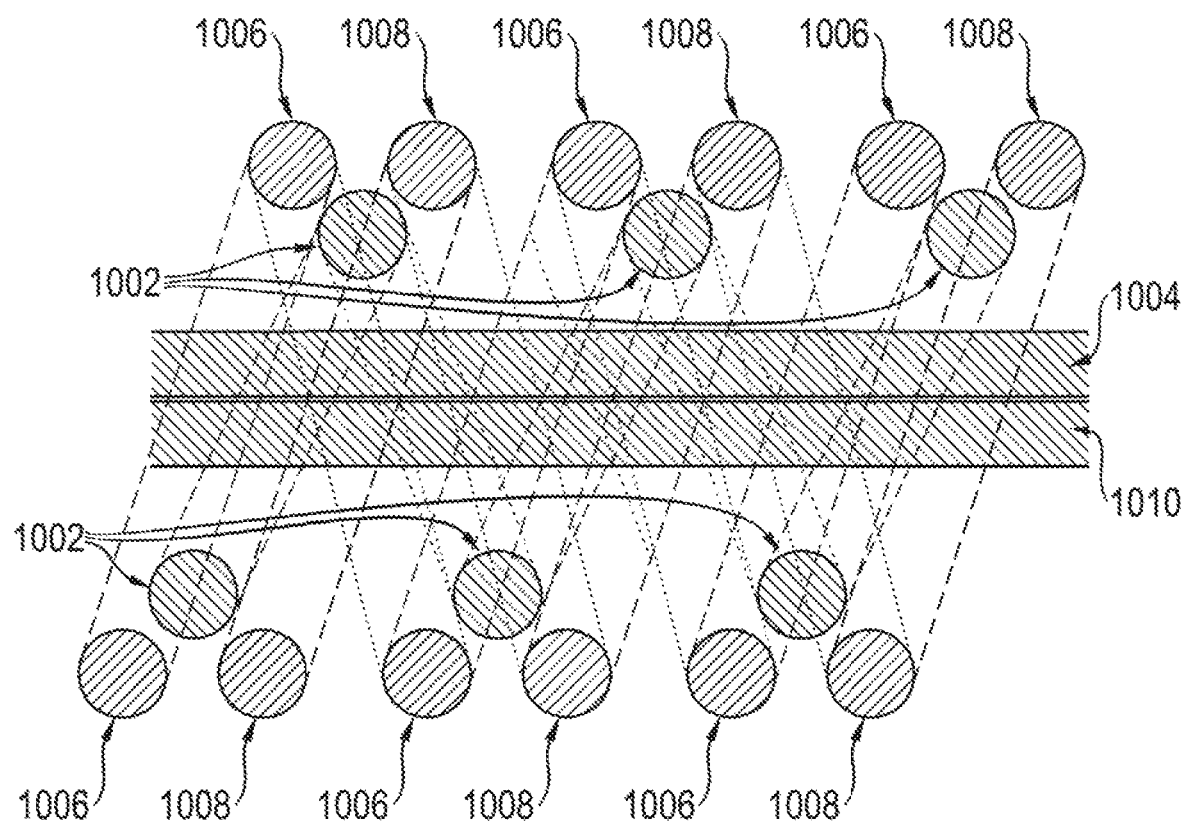
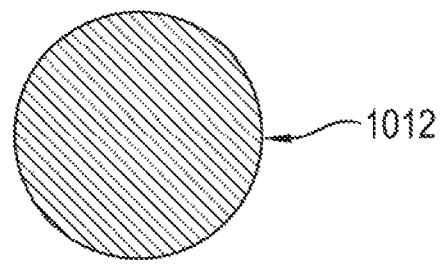
Fig. 10

METHOD AND SENSOR FOR MEASURING AN ALTERNATING CURRENT

CROSS-REFERENCE TO RELATED APPLICATIONS

This application claims priority to German Patent Application No. DE 10 2016 124 165.2, filed Dec. 13, 2016, which is incorporated by reference herein in its entirety.

FIELD OF THE INVENTION

The present invention relates to a method and sensor for measuring an alternating current in a power line using a Rogowski-Steinhaus-Chattock coil.

BACKGROUND OF THE INVENTION

Exact current measurements are of central importance in electrical engineering. Current measurements in control loops, for example, thus normally directly determine a quality of a respective entire system. A Rogowski-Steinhaus-Chattock coil, which enables measurements with very high bandwidths, can be used to measure electric current flowing in a measurement object.

A Rogowski-Steinhaus-Chattock current sensor comprises at least one Rogowski-Steinhaus-Chattock coil which is made up of a toroidal conductor loop of circular design, a measuring device and corresponding feed lines between the measuring devices and the at least one Rogowski-Steinhaus-Chattock coil. The feed lines and the Rogowski-Steinhaus-Chattock coil are referred to below as the measuring line. Line sections of the feed lines and the Rogowski-Steinhaus-Chattock coil are also referred to in each case in their own right as the measuring line. In order to arrange the Rogowski-Steinhaus-Chattock coil vertically around a conductor in a line system whose current is to be measured, the circle of the toroidal conductor loop may have an opening. The return line of the toroidal conductor loop ending at the opening is normally routed through the inside of the Rogowski-Steinhaus-Chattock coil. Rogowski-Steinhaus-Chattock coils represent a simple and reliable method for identifying a current flow in an electrical line system. A current flow that is to be measured causes a magnetic field surrounding the conductor which induces a voltage in a Rogowski-Steinhaus-Chattock coil located around the conductor. The current in the conductor can then be calculated from this voltage. Rogowski-Steinhaus-Chattock current sensors are used in a wide frequency range of alternating currents. Measurement interference increasingly predominates with increasing frequency of the alternating currents that are to be measured.

As mentioned above, a Rogowski-Steinhaus-Chattock coil consists of a measuring line wound into a toroid, said line normally being wound as an outgoing conductor in the form of helical spiral and, after a turning point, being routed as a return conductor within the toroid back to a start of the toroid. The Rogowski-Steinhaus-Chattock coil (A. P. Chattock (1887). On a magnetic potentiometer. Proceedings of the Physical Society of London on 23-26; W. Rogowski and W. Steinhaus (1912). Die Messung der magnetischen Spannung: Messung des Linienintegrals der magnetischen Feldstärke [*The measurement of the magnetic voltage: Measurement of the line integral of the magnetic field strength*]. Archiv für Elektrotechnik [*Electrical Engineering Archive*], 1(4): 141-150) uses a toroidal coil to be positioned around a measuring current or around a conductor carrying the measuring current. Nevertheless, the coil does not necessarily have to surround the conductor, see S. Hain, M. Bakran (2014). Highly dynamic current measurements with inductive current sensors—a numerical recipe. PCIM Europe, 1617-1624. In order to measure, by means of a Rogowski-Steinhaus-Chattock coil, a voltage signal which is proportional to the drainage of an electric current that is to be measured, the Rogowski-Steinhaus-Chattock coil should be wound very evenly.

The Rogowski-Steinhaus-Chattock coil enables a measurement of alternating currents in very high bandwidths from the millihertz into the megahertz range. However, when traditional Rogowski-Steinhaus-Chattock coils are used for current measurement, limitations arise in the case of an alternating current at a frequency of a few megahertz due to physical characteristics of the Rogowski-Steinhaus-Chattock coil. It has become apparent that occurring electrical capacitances, in particular, within a respective Rogowski-Steinhaus-Chattock coil and also between the Rogowski-Steinhaus-Chattock coil and a measurement object or the earth have an influence on a measurement accuracy of a current measured by means of the Rogowski-Steinhaus-Chattock coil. In particular, four types of electrical capacitances which impact on the measurement accuracy of a Rogowski-Steinhaus-Chattock coil can be identified.

Thus, particularly in the case of a high frequency of an alternating current flowing through the Rogowski-Steinhaus-Chattock coil, an electrical capacitance occurs between any two, in particular adjacent, windings of Rogowski-Steinhaus-Chattock coil. This electrical capacitance has a stronger effect, the higher a voltage difference between respective windings becomes, since a coupling between the capacitance and a voltage difference between the respective windings produces an effect. A voltage difference of this type increases with a frequency of a respective alternating current flowing through the coil as soon as voltage differences already develop between adjacent windings of the Rogowski-Steinhaus-Chattock coil due to a short wavelength of the alternating current. Furthermore, a voltage difference between respective windings of a Rogowski-Steinhaus-Chattock coil increases with a reduction in the physical distance between respective windings. However, in order to increase a sensitivity of a respective Rogowski-Steinhaus-Chattock coil, the distance between respective windings of the Rogowski-Steinhaus-Chattock coil is frequently reduced or minimized and the number of windings is increased or is selected to be as large as possible so that, according to the explanations set out above an occurrence of capacitances between the windings is encouraged.

Similar to the electrical capacitance between respective windings of a Rogowski-Steinhaus-Chattock coil, an electrical capacitance may occur between a respective winding and a return conductor routed inside a Rogowski-Steinhaus-Chattock coil and may be considered as virtually equivalent to an electrical capacitance between any two windings.

Furthermore, an electrical capacitance occurs between each individual conductor part of a Rogowski-Steinhaus-Chattock coil and a respective measurement object or the earth. An influence of a coupling between a respective conductor part of the Rogowski-Steinhaus-Chattock coil and the measurement object increases with a voltage and a frequency of an electric current flowing in the measurement object.

If a Rogowski-Steinhaus-Chattock coil acts as an electrical shield, a coupling furthermore occurs between each individual conductor part of a respective Rogowski-Steinhaus-Chattock coil and a respective shield potential.

In addition, all capacitances of respective Rogowski-Steinhaus-Chattock coil, together with a respective inductance, form filters or resonances which may reduce a measurement bandwidth by orders of magnitude. An impedance generally decreases over a capacitance with increasing frequency of an alternating current that is to be measured, for which reason signals and interference occur particularly frequently over capacitances, particularly at high frequencies.

US-American document US 2008 0106 253 A1, which is incorporated by reference herein, discloses a Rogowski-Steinhaus-Chattock coil arrangement with two Rogowski-Steinhaus-Chattock coils which both surround a conductor that is to be measured. Signals of both coils are offset against one another in order to identify interference within respective measured signals.

US-American document US 2010 0109 643 A1, which is incorporated by reference herein, discloses a current sensor with three connected coil elements which are arranged in the vicinity of a conductor that is to be measured.

A combined measurement device with a current sensor and a voltage sensor and also a common electromagnetic shielding is disclosed in US-American document US 2011 0089 933 A1, which is incorporated by reference herein.

US-American document US 2015 0028 852 A1, which is incorporated by reference herein, discloses a current sensor which consists of two coaxial Rogowski-Steinhaus-Chattock coils.

International document WO 2014 060 106 A1, which is incorporated by reference herein, discloses a current and/or voltage-sensing device in which a current sensor and/or a voltage sensor is/are arranged within a toroid body surrounding a conductor that is to be measured.

SUMMARY OF THE INVENTION

Against this background, one object of the present invention is to provide a facility for fast and accurate measurement of an electric current flowing through a measurement object.

A method for measuring a temporal drainage of an alternating current flowing through a measurement object is thus proposed, in which a Rogowski-Steinhaus-Chattock coil is aligned on the measurement object, at least one isolating line is inserted into coil windings of the Rogowski-Steinhaus-Chattock coil, said isolating line minimizing, or at least reducing, a capacitive coupling of coil windings of the Rogowski-Steinhaus-Chattock coil with one another and/or with at least one further electrical line, and a temporal drainage of an alternating current flowing in the measurement object is calculated via a voltage induced by the alternating current in at least one measuring line comprising the Rogowski-Steinhaus-Chattock coil. A potential difference between at least one point on the at least one isolating line comprised by the Rogowski-Steinhaus-Chattock coil and a point on a measuring line comprising the Rogowski-Steinhaus-Chattock coil closest to this point on the isolating line is minimized, as a result of which the at least one isolating line absorbs field lines of the Rogowski-Steinhaus-Chattock coil to at least one dielectrically active object and minimizes a capacitive coupling of the Rogowski-Steinhaus-Chattock coil to the at least one dielectrically active object.

In the ideal case, a measurable voltage induced on the Rogowski-Steinhaus-Chattock coil is proportional to the temporal drainage of the alternating current that is to be measured. Due to this temporal drainage, the voltage is also proportional to the voltage of the alternating current that is to be measured. In order to obtain a current-dependent signal, i.e. a direct value for the alternating current that is to be measured, the characteristic of the voltage must be temporally integrated accordingly.

The alternating current is ultimately measured via a temporal integral of the measured temporal drainage of the alternating current.

The proposed method serves, in particular, to shield a respective measuring line of a Rogowski-Steinhaus-Chattock current sensor against electromagnetic interference from the Rogowski-Steinhaus-Chattock coil itself and/or from an electric current flowing in a respective measurement object and/or the earth or against electrical interactions of the respective measuring line of the Rogowski-Steinhaus-Chattock coil with a part of the Rogowski-Steinhaus-Chattock coil itself and/or an electric current flowing through a respective measurement object and/or the earth. To this end, it is provided, in particular, that a potential difference between at least one isolating line inserted into the Rogowski-Steinhaus-Chattock coil and the measuring line comprising the Rogowski-Steinhaus-Chattock coil is minimized on at least one point on the at least one isolating line and a corresponding closest point on the measuring line. This means that the at least one isolating line is introduced into the Rogowski-Steinhaus-Chattock coil or is arranged on the Rogowski-Steinhaus-Chattock coil in such a way that, at any time, a potential caused by a voltage induced by the electric current flowing in the measurement object and/or any given dielectric object in the at least one isolating line is or becomes essentially equal to a correspondingly caused electric potential at a point on the at least one measuring line of the Rogowski-Steinhaus-Chattock coil closest to the point on the isolating line.

Due to the minimization provided according to aspects of the invention of an electric voltage between the at least one isolating line provided according to aspects of the invention and the measuring line of the Rogowski-Steinhaus-Chattock sensor, or a corresponding setting of a potential of the at least one isolating line so that each point on the at least one isolating line has the same electric potential as a closest point on the measuring line, the at least one isolating line absorbs field lines of the measuring line, in particular of the Rogowski-Steinhaus-Chattock coil, to respective dielectrically active objects and reduces a capacitive coupling between the respective dielectrically active objects and the measuring line or completely prevents the capacitive coupling between the respective dielectrically active objects and the measuring line.

In order to reduce or prevent a capacitive coupling between the measuring line of the Rogowski-Steinhaus-Chattock coil and a respective dielectrically active object, it is provided according to aspects of the invention, in particular, that an electric current flowing in a respective measurement object is used as an electricity source in order to feed the isolating line provided according to aspects of the invention with electricity so that an electrical coupling of the measuring line or the Rogowski-Steinhaus-Chattock coil with parts of the measuring line or the Rogowski-Steinhaus-Chattock coil itself and/or the measurement object and/or the earth is minimized. To do this, the isolating line reduces an effective coupling $C*\Delta V$ of existing capacitances and a respectively prevailing voltage difference. Depending on which coupling into be reduced, the isolating line must have a corresponding line routing and/or impedance and/or termination.

A current flowing in a respective measurement object, i.e. a respective electric current that is to be measured, induces an electric field E and an associated voltage V in a respective measuring line of the Rogowski-Steinhaus-Chattock coil and in an isolating line. In order to enable an optimum measurement of the electric current and minimize electromagnetic interference on the measuring line accordingly, a characteristic of the isolating line must be selected in such a way that the isolating line, on the one hand, shields the measuring line from a respective opposite pole of a capacitive interference radiation and, on the other hand, as far as possible, the same potential characteristic is induced in the isolating line and the measuring line by the electric current that is to be measured. A magnetic field of the electric current that is to be measured induces an electric voltage in both the isolating line and the measuring line so that the voltage increases in relation to a reference potential in both the measuring line and the isolating line.

In one possible design of the proposed method, it is provided that the electric potential of the at least one point on the at least one isolating line which is intended to have a minimum potential difference in relation to the point on the measuring line closest to it is set by means of an electrical regulating element from the following list of electrical regulating elements: potentiometer, adjustable resistor or direct-current source.

In order to equalize electric potentials between the isolating line and the measuring line occurring along are isolating compared with a measuring line, for example due to manufacturing tolerances or due to deliberately provided differences between the isolating line and the measuring line, or in order to achieve voltage conditions similar to those in the measuring line over an entire length of the isolating line, respective ends of the isolating line must be terminated in a manner that is electrically similar or identical to the measuring line. An electrical termination of the measuring line may comprise, for example, an amplifier input impedance, a line to a corresponding amplifier or a line termination to prevent reflections. A corresponding impedance may have a real component, i.e. a resistance, and also a complex phase-shifting component, i.e. an inductance and/or capacitance. For this purpose, an electrical regulating element which, for example, increases or decreases an impedance of the isolating line or increases or decreases a voltage applied to the isolating line may be connected, for example, as a termination on the isolating line.

In a further possible design of the proposed method, it is provided that the at least one isolating line is terminated with the same impedance as the measuring line so that the total impedances of both coils or of the isolating line and the measuring line are, as far as possible, identical to one another.

A termination of the isolating line provided according to aspects of the invention can be used to equalize manufacturing tolerances or manufacture-related, construction-related or design-related differences between the isolating line provided according to aspects of the invention and the measuring line or the Rogowski-Steinhaus-Chattock coil. Thus, for example, the isolating line does not necessarily have to have a feed line that is several meters in length, as is typically provided in the case of a measuring line, but could alternatively end close to the Rogowski-Steinhaus-Chattock coil, wherein, however, the impedance of the connection cable or the feed line that is then lacking compared with the measuring line must be simulated on the isolating line.

A termination in the form of an electrical impedance is furthermore suitable for equalizing differences between the measuring line and the isolating line which occur, for example, due to differently-sized toroids of the measuring line and isolating line, without modifying a respective installation path of the two lines. Insofar as a respective measuring line and a respective isolating line have an only affinely linearly different increase in an induced voltage over a respective line length and therefore a relation according to equation (1) is possible with two constants $C_1$ and $C_2$, the constant $C_1$ can be adapted via a terminal impedance of the isolating line. Conversely, the constant $C_2$ can be set via a corresponding potential referencing.

$$dV_{meas}/dl_{meas} = C_1 dV_{isol}/dl_{isol} + C_2 \qquad (1)$$

wherein $dV_{meas}/dl_{meas}$ designate the voltage increase over the line length of the measuring line and $dV_{isol}/dl_{isol}$ designate the voltage increase over the line length of the isolating line.

A difference between the measuring line or measuring winding and the isolating line or isolating winding may occur, for example, due to differently-sized cross-sectional areas of the respective toroids of the windings.

For example, isolating lines for an isolation of a respective measuring line or the Rogowski-Steinhaus-Chattock coil from electromagnetic interference located outside the Rogowski-Steinhaus-Chattock coil and from a coupling to a respective electric current that is to be measured are intended to be located continuously outside the measuring line or the Rogowski-Steinhaus-Chattock coil and consequently to be wound around the measuring line in the toroidal part of the Rogowski-Steinhaus-Chattock coil with a radius that is greater than that of the measuring line. Correspondingly, a toroid formed by the isolating line has a larger cross-sectional area than a toroid formed by the measuring line, so that a higher increase in the voltage with the length along the respective toroid occurs in the toroid formed by the isolating line compared with the toroid formed by the measuring line. Due to a reduction in a terminal impedance of the toroid formed by the isolating line, this increase in the voltage with the length along the toroid can be adapted to the toroid formed by the measuring line.

A reduction in a terminal impedance of the isolating line provided according to aspects of the invention results in a lower measuring voltage, since the corresponding source (induced voltage into the toroid coil formed by the measuring line) has a finite internal resistance and can be depleted accordingly by excessively high current flow. A depletion increasing in this way can be achieved through a reduction in the terminal impedance of the isolating line. In the case of a terminal impedance of zero, i.e. in the case of a short circuit, only an internal resistance of a respective Rogowski-Steinhaus-Chattock coil defines a current flow through the Rogowski-Steinhaus-Chattock coil and a total voltage at respective ends or the Rogowski-Steinhaus-Chattock coil fades away, so that equation (2) applies:

$$\int_0^l (dV/dl) dl = 0 \qquad (2)$$

A phase of a signal of the isolating line and therefore a phase of a voltage at each point on the isolating line can be broadly set via a ratio of the real and imaginary part from equation (2).

An increase in a terminal impedance of the isolating line provided according to aspects of the invention has a correspondingly counteracting effect and may, for example, compensate for a smaller toroidal radius of a winding of the isolating line, for example in the case of an isolation of the measuring line from a return line inside the Rogowski-Steinhaus-Chattock coil.

Through an adaptation of a terminal impedance of the isolating line, according to aspects of the invention, it is possible to forego an impedance matching of a respective Rogowski-Steinhaus-Chattock coil or a measuring line comprising the Rogowski-Steinhaus-Chattock coil, which would entail a risk of significantly deteriorating a source impedance of a respective measuring signal and, as a result, a sensitivity and a noise behavior of the Rogowski-Steinhaus-Chattock coil or the measuring line.

The method according to aspects of the invention is essentially based on the fact that an electric alternating current that is to be measured induces an electric potential in an isolating line which corresponds to a position of the isolating line in space. If, for example, an isolating line is positioned on an axis between two measuring lines with a locally approximately homogeneous magnetic field of a respective electric current that is to be measured and if all lines are connected at a distant identical location, a potential $V_p$ is set approximately at a corresponding point on the isolating line, said potential, according to the Poisson equation, corresponding approximately to an average of respective potentials, weighted with respective distances, of respective points on the two measuring lines adjacent to the point on the isolating line. In order to modify these potential ratios and, for example, to take a point on the isolating line locally onto a potential of an immediately closest point on one of the measuring lines, a voltage present on the isolating line must be set so that the voltage between the point on the isolating line and the immediately closest point on the measuring line is minimal.

In order to set a voltage present on a respective point on an isolating line to a voltage present on an immediately closest point on a measuring line, it can be provided in a design of the proposed method that at least one point on the measuring line is short-circuited with at least one point on the isolating line closest to the at least one point on the measuring line.

Furthermore, a voltage of at least two points closest to one another on isolating line of and a measuring line can be set in such a way that any voltage generated by a magnetic induction in an alternative shorting bar would be compensated.

In a further possible design of the proposed method, it is provided that a voltage source, by means of which a voltage present on the at least one isolating line is set according to a voltage present on the measuring line, is connected between at least one point on the measuring line and at least one point on the at least one isolating line closest to the at least one point on the measuring line.

In a further possible design of the proposed method, it is provided that the voltage source is connected at one end of the at least one isolating line and/or the measuring line.

A use of alternative voltage sources, such as, for example, a direct-current source, between any two points on an isolating line and a measuring line or at a respective end of the isolating line and the measuring line is obviously also conceivable in order to equalize voltage differences between points on the isolating line and the measuring line correspondingly closest to one another.

In a further possible design of the proposed method, it is provided that two isolating lines are wound into the Rogowski-Steinhaus-Chattock coil in such a way that a respective winding of the at least one measuring line, i.e. of the Rogowski-Steinhaus-Chattock coil, is isolated on a first side by a first isolating line and on a second side by a second isolating line from a capacitive interference radiation of an adjacent winding of the at least one measuring line, i.e. of the Rogowski-Steinhaus-Chattock coil, into the respective winding.

In order to minimize a capacitance between respective adjacent windings of a Rogowski-Steinhaus-Chattock coil, a use of at least two isolating lines is particularly advantageous, since a first isolating line can protect a respective winding on a first side and a second isolating line can protect the respective winding on a second side against electromagnetic interference. Each isolating line is referenced in terms of its electric potential against the measuring line by setting a corresponding voltage. The referencing, i.e. the application of a voltage which, on a respective isolating line, results in a voltage corresponding to the measuring line can take place at virtually any point, such as, for example, at one end or in the middle of a respective isolating line. A plurality of points can obviously also be referenced, i.e. can be supplied, where appropriate, with voltage, wherein an occurrence of ring currents over respective windings of the isolating lines and the measuring line must be taken into account in order to avoid an increased coupling of the measuring line with the isolating lines and corresponding distortions.

In a further possible design of the proposed method, it is provided that an electric potential corresponding to an electric potential present on the measuring line is set on each of the two isolating lines.

A voltage necessary for a referencing may be generated, for example, by a voltage source, such as, for example, a battery cell, a power supply unit or any other voltage source.

In a further possible design of the proposed method, it is provided that a voltage required to set the electric potential on each of the two isolating lines is generated by means of a number of additional windings of at least one of the isolating lines or isolating windings, wherein the number and a cross-sectional area of the windings are selected in such a way that the required voltage is set on the basis of an alternating magnetic field of a respective current that is to be measured.

Furthermore, a voltage necessary for a referencing can also be provided via a direct electrically conducting connection of corresponding points on a measuring and an isolating line or can be generated by means of additional windings in an isolating line. Central parameters for potential-referencing windings which, with suitable dimensioning, automatically provide a suitable voltage due to an alternating magnetic field of an electric current that is to be measured are a number of windings and a cross-sectional area of respective windings. A potential-referencing adaptation can obviously take place over a multiplicity of windings which in each case have different cross-sectional areas. The generation of a voltage by respective potential-referencing windings is influenced by the following factor:

$$\mu A N / (2\pi R) \tag{3}$$

Here, "$\mu$" represents a magnetic permeability, "A" a cross-sectional area of a respective potential-referencing winding, "N" a number of potential-referencing windings and "R" a distance from a respective electric current that is to be measured.

In a further possible design of the proposed method, it is provided that the least one isolating line is designed in such a way that an influence of electromagnetic interference waves on the at least one measuring line is minimized.

Along with a reduction in an electromagnetic coupling of a measuring line in relation to further dielectrically active objects or further parts of the measuring line, the isolating line provided according to aspects of the invention also acts as a conventional shield against electrical influences due, for example, to high-frequency interference and waves.

In a further possible design of the proposed method, it is provided that the at least one measuring line is protected by means of the at least one isolating line against magnetic interactions with an interference source, wherein the at least one isolating line is wound in such a way that eddy currents are generated due to the magnetic interactions in the at least one measuring line, as a result of which an energy of the magnetic interactions is reduced.

High-frequency waves can be magnetically shielded, for example, by means of the isolating line provided according to aspects of the invention. An isolating line can develop a magnetic shielding which is adjustable via two parameters depending on the frequency range.

For low-frequency interference with wavelengths far above a thickness of a respective isolating line, the shielding effect depends on a terminal impedance of the isolating line or the isolating winding. The terminal impedance must be so to that these respective induced electric currents can deprive an electromagnetic interference radiation of a substantial part of its energy.

High-frequency interference with wavelengths which are essentially in the region of or only slightly greater than a diameter of a respective isolating line can cause eddy currents in the isolating line, as a result of which energy is reduced.

The proposed Rogowski-Steinhaus-Chattock sensor serves, in particular, to carry out the proposed method.

In one possible design of the proposed Rogowski-Steinhaus-Chattock sensor, it is provided that the at least one measuring line, together with the at least one isolating line, forms a coaxial line.

By means of a coaxial line in which a measuring line is surrounded by an isolating line, a shielding of the measuring line by the isolating line can be effected in all directions.

In a further possible design of the proposed Rogowski-Steinhaus-Chattock sensor, it is provided that the at least one isolating line is inserted in each case between two windings of the at least one Rogowski-Steinhaus-Chattock coil.

By means of a coil which is interwoven into a coil formed by a measuring line and which forms at least a part of the isolating line interactions between respective parts of the measuring line, i.e. influences of respective windings on one another, can particularly advantageously be reduced.

In a further possible design of the proposed Rogowski-Steinhaus-Chattock sensor, it is provided that the at least one isolating line is routed around the Rogowski-Steinhaus-Chattock coil on a side opposite an inside of the Rogowski-Steinhaus-Chattock coil.

Electromagnetic interference of the earth or of a further dielectrically active object on a measuring line of the Rogowski-Steinhaus-Chattock coil can be particularly advantageously reduced by means of an isolating line routed on a side opposite an inside of a Rogowski-Steinhaus-Chattock coil, i.e. on an outer side of the Rogowski-Steinhaus-Chattock coil.

In a further possible design of the proposed Rogowski-Steinhaus-Chattock sensor, it is provided that the at least one isolating line is routed around the Rogowski-Steinhaus-Chattock coil on a side facing an inside of the Rogowski-Steinhaus-Chattock coil.

Electromagnetic interference of a respective measurement object can be particularly advantageously minimized by means of an isolating line routed on a side facing an inside of a Rogowski-Steinhaus-Chattock coil, i.e. on an inner side of the Rogowski-Steinhaus-Chattock coil.

A method is furthermore provided for providing a Rogowski-Steinhaus-Chattock sensor of this type in which at least one isolating line, is inserted into coil windings of a Rogowski-Steinhaus-Chattock coil said isolating line having a capacitive coupling of the coil windings of the Rogowski-Steinhaus-Chattock coil with one another and/or with at least one further electrical line.

Further advantages and designs can be found in the description and the attached drawings.

The features specified above and still to be explained below are obviously usable not only in the respectively indicated combination, but also in other combinations or in isolation without departing the scope of the present invention.

BRIEF DESCRIPTION OF THE DRAWINGS

The invention is shown schematically in the drawings on the basis of embodiments and is described schematically and in detail with reference to the drawings.

FIG. 10 shows a further possible embodiment of an arrangement according to aspects of the invention of a Rogowski-Steinhaus-Chattock coil and two provided isolating lines.

DETAILED DESCRIPTION OF THE INVENTION

The Rogowski-Steinhaus-Chattock coil is to be understood as part of the measuring line or the measuring line is wound at least in part to form at least one Rogowski-Steinhaus-Chattock coil.

Figure 1:
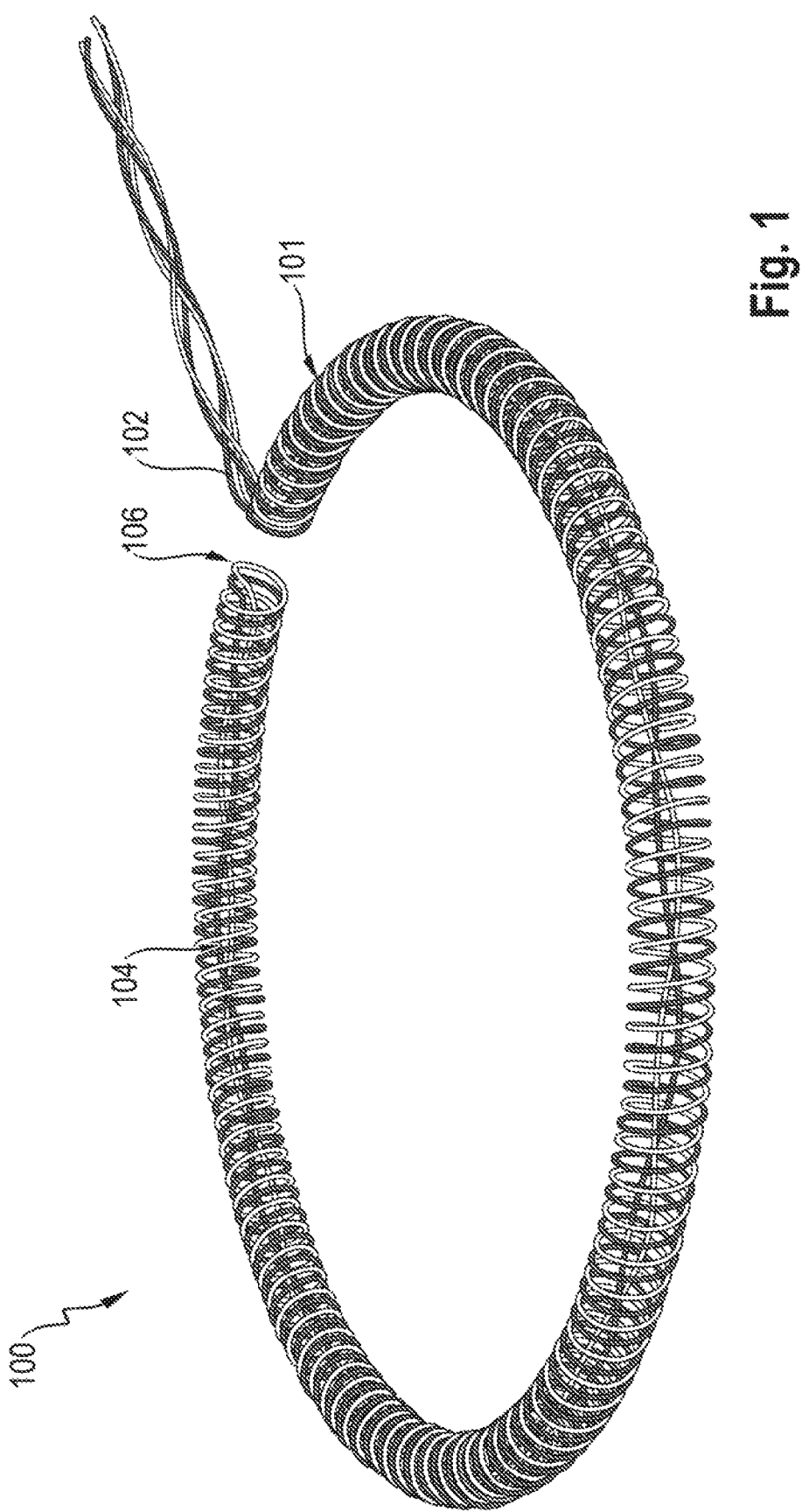
FIG. 1 shows in schematic representation an embodiment of a sensor according to aspects of the invention which is also referred to in the context of the present description as a Rogowski-Steinhaus-Chattock sensor.

FIG. 1 shows a Rogowski-Steinhaus-Chattock (coil) sensor 100 which comprises a Rogowski-Steinhaus-Chattock coil 101 which is designed as part of a measuring line 102 and into which an isolating line 106 has been interwoven according to aspects of the invention. By means of the embodiment shown, the isolating line 106 as far as possible has the same electric potential along its entire length as the closest point on the adjacent measuring line 102 of the Rogowski-Steinhaus-Chattock coil 101. A suitable connection of the isolating line 106 within the Rogowski-Steinhaus-Chattock sensor 100 enables the voltage difference $\Delta V$ between the measuring line 102 of the Rogowski-Steinhaus-Chattock coil 101 and electric conductors to be kept close to zero, as far as possible at any time. Possible implementations of this connection are shown in further figures. An electric conductor with which the measuring line 102 or each individual conductor part of the measuring line 102 can form a voltage difference or has a capacitance may be any winding of the Rogowski-Steinhaus-Chattock coil 101 itself, an internal return conductor 104, a measurement object through which current flows or earth (earth potential), or a possibly present shielding. The isolating line 106 leaves the aforementioned capacitances C unchanged, but a minimization of the voltage difference $\Delta V$ achieved with the suitable connection results in a reduction in the effective coupling $C\Delta V$, since electric field lines to other dielectrically active objects are, in a manner of speaking, swallowed up. The isolating line 106 is fed by a current that is to be measured, i.e. an alternating current in the measurement object (not shown here) which, due to its magnetic field surrounding it, induces an electric voltage into the measuring line 102 and the isolating line 106, said voltage increasing the voltage relative to the reference potential in the Rogowski-Steinhaus-Chattock sensor 100.

Figure 2:
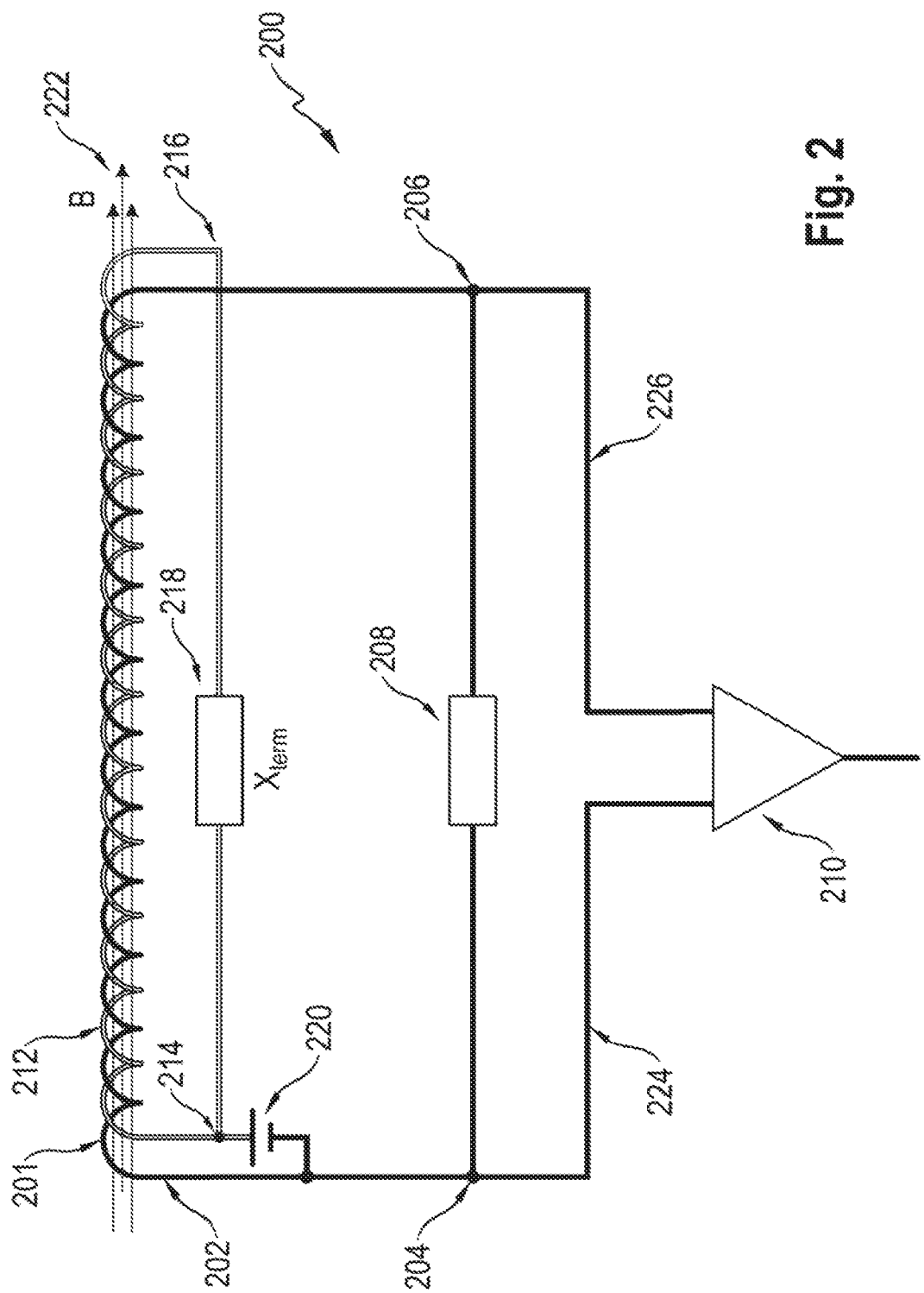
FIG. 2 shows in schematic representation a possible circuit diagram for the connection according to aspects of the invention of an isolating line provided according to aspects of the invention within embodiment of the Rogowski-Steinhaus-Chattock sensor according to aspects of the invention.

FIG. 2 shows a circuit diagram for the connection of an isolating line 212 within a Rogowski-Steinhaus-Chattock sensor 200 or within a Rogowski-Steinhaus-Chattock coil 201. Since voltage ratios which are as similar as possible are intended to prevail over the entire length of the Rogowski-Steinhaus-Chattock coil 201 in the measuring line 202 and in the isolating line 212, respective ends 214 and 216 of the isolating line 212 must be terminated in a manner that is electrically similar or identical to the respective ends 204 and 206 of the measuring line 202. In the measuring line 202, the electrical termination may consist, for example, of lines 224 and 226 to an amplifier 210 and/or an impedance 208 which may represent an amplifier input impedance or a line termination (e.g. to prevent reflections). The impedance 208 may have a real component (the electrical resistance) and a complex, phase-shifting component (inductance and/or capacitance). In order to achieve voltage ratios that are as similar as possible in the measuring line 202 and in the isolating line 212, the isolating line 212 can therefore be terminated in the simplest case with a terminating impedance $X_{term}$. $X_{term}$ is intended to have the same quantity as the impedance 208, so that a total impedance of the measuring line 202 and of the isolating line 212 is as equal as possible.

Furthermore, the termination of the isolating line 212 by means of the terminating impedance 218 can be used to equalize manufacture-related, construction-related or design-related differences between the measuring line 202 and the isolating line 212 which can, for example, cause a slight overcompensation or undercompensation of the measurement interference.

Furthermore, the isolating line 212 may already be terminated close to the Rogowski-Steinhaus-Chattock coil 201 so that the isolating line 212 does not have to have the same feed line path, for example the length of several meters, of the measuring line 202 between the Rogowski-Steinhaus-Chattock coil 201 and the amplifier 210. In this case, however, the impedance that is lacking in comparison with the feed line path of the measuring line 202 must be compensated through the selection of the terminating impedance $X_{term}$.

The terminal impedance is furthermore suitable for equalizing differences in a winding of an isolating line 212 and the measuring line 202. Differences of this type may arise, for example, if a winding of an isolating line 212 has a different cross-sectional area than the winding of the Rogowski-Steinhaus-Chattock coil 201 as part of the measuring line 202. If both windings have an only affinely linearly different increase in the induced voltage over the line length, the equation $dV_{meas}/dl_{meas}=C_1 dV_{isol}/dl_{isol}+C_2$ applies, with a measuring voltage $V_{meas}$, a measuring line length $l_{meas}$, an isolating voltage $V_{isol}$, an isolating line length $l_{isol}$, and constants $C_1$ and $C_2$. The constant $C_1$ can be adapted via the terminating impedance 218. Conversely, $C_2$ can be set via a corresponding potential referencing. As an example in which this procedure is advantageous, an embodiment can be cited in which at least one isolating line is located continuously outside the measuring line for isolation from influences located outside the Rogowski-Steinhaus-Chattock coil and from a coupling to the current that is to be measured. Consequently, the cross-sectional area of the winding of the isolating line is greater than that of the Rogowski-Steinhaus-Chattock coil as part of the measuring line and therefore the voltage induced into the isolating line is greater than the voltage induced into the measuring line, or a greater increase dV/dl in the voltage V takes place with a coil length l. This dV/dl can be adapted to the measuring line through a reduction in the terminal impedance.

A reduction in the terminal impedance results in a lower measuring voltage, since the source (induced voltage into the toroidal coil) has a finite internal resistance and can therefore be depicted by excessively high current flow. Such an increasing depletion is achieved through a reduction in the terminal impedance. In the case of a terminal resistance amounting to 0 (short circuit), only the internal resistance of the coil still defines the current flow. The total voltage at the ends and therefore the integral of the increase dV/dl fades away over the entire coil length. The phase of the signal of the isolating line and therefore the phase of the voltage at each point can be broadly set via the ratio of the real and imaginary part.

An increase in the terminal impedance has a correspondingly counteracting effect and may, for example, compensate for a smaller toroidal radius of the isolating winding, for example in the case of isolation of a measuring winding of the measuring line from an internal return conductor of the type normally provided in the Rogowski-Steinhaus-Chattock coil.

It is evident from the aforementioned procedures that the modification of the terminating impedance of the measuring line 202 and therefore its adaptation can be foregone. The risk of adversely affecting the sensitivity and noise behavior of the Rogowski-Steinhaus-Chattock sensor 200 through an adaptation of this type does not therefore exist.

Figure 3:
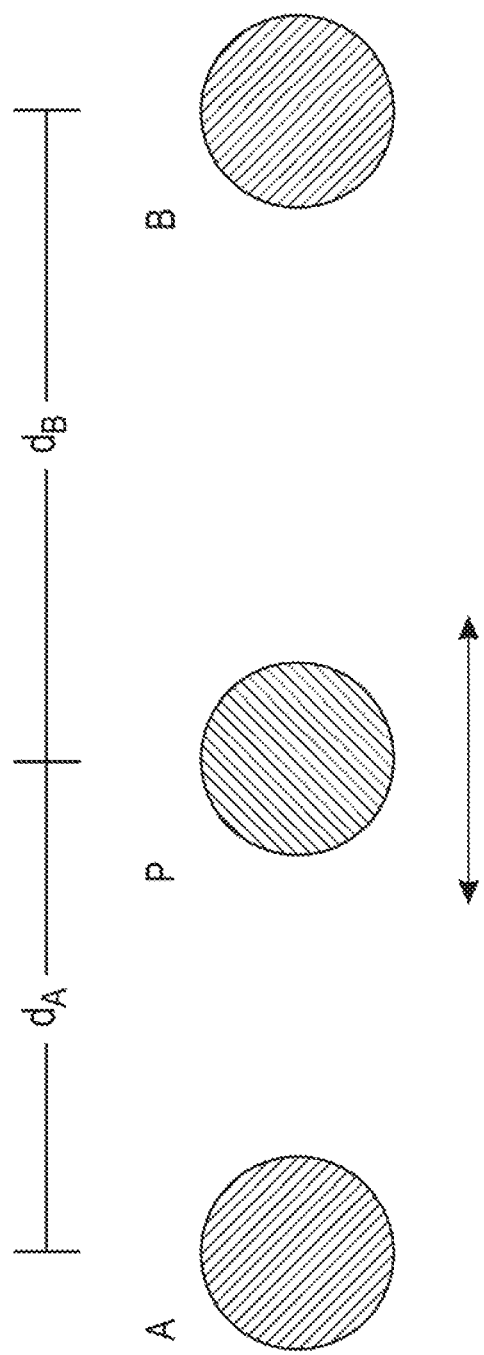
FIG. 3 shows in schematic representation a cross section through an upper section of adjacent coil windings of an isolating line provided according to aspects of the invention and a Rogowski-Steinhaus-Chattock coil.

FIG. 3 shows a cross section through an upper section of two adjacent coil windings at points A and B on a Rogowski-Steinhaus-Chattock coil, and at a point P on an isolating line interwoven between them. A current that is to be measured induces a potential into the isolating line at point P, said potential corresponding to a position of the point P on the isolating line in space. If, for example, the isolating line is positioned at point P on the axis between the two measuring lines at points A and B with a locally approximately homogeneous magnetic field of the current that is to be measured, and the measuring line and the isolating line are connected at a distant identical location to the same reference potential, a potential $V_P$ is set approximately at point P on the isolating line, said potential, according to the Poisson equation, roughly corresponding to the average of the potentials $V_A$ and $V_B$, weighted with the distances $d_A$ and $d_B$, of adjacent points A and B on the measuring lines, $V_P=(d_B V_A + d_A V_B)/(d_A+d_B)$. The following measures can be taken to modify these potential ratios, for example to bring the point P on the isolating line locally onto the potential of the immediately closest point A on the measuring line.

A magnetic flow density 222 (see FIG. 2) having a quantity B caused by a current that is to be measured first induces the same voltage per length with conductor routing of the measuring line 202 and the isolating line 212 located close to one another.

In order to minimize the voltage difference between the measuring line at point A and the closest point P on the isolating line, along with the same voltage per conductor length or conductor location, i.e. consequently along with the same potential increase, the potential of at least one point on the isolating line must also be referenced onto at least one potential of the measuring line. This corresponds to the setting of the voltage between at least one point on the measuring line and at least one point on the isolating line.

The referencing of the isolating line onto a measuring line can take place at any point. For example, this can be carried out at one of the ends or in the middle of the Rogowski-Steinhaus-Chattock coil. Furthermore, a plurality of points can be referenced.

In the ideal case, this voltage is set so that the voltage between two points with a minimum distance from one another, one of them on the measuring line, the other on the isolating line, is or becomes infinitesimally small.

Without restricting further embodiments, this can be achieved, by way of example, by short-circuiting (voltage zero) any point on the isolating line with the point located spatially closest on the measuring line.

Furthermore, a setting of a voltage between at least two points closest to one another on the measuring line and the isolating line can enable a voltage generated by a magnetic induction in an alternative shorting bar to be compensated.

Furthermore, this can be achieved by using a voltage source between any two points between the measuring line and the isolating line.

Furthermore, this can be achieved by using a voltage source at one of the ends of the coils, for example shown by the voltage source 220 in FIG. 2.

The necessary voltage can be generated with a voltage source known from the prior art, for example by means of battery cells or power supply units. Points on the measuring line and the isolating line which have the necessary potential difference can also be used via electrically conducting connections. Furthermore, windings can additionally be incorporated into the Rogowski-Steinhaus-Chattock coil which automatically provide the necessary voltage due to the alternating magnetic field of the current that is to be measured with suitable dimensioning (number of windings, cross-section size).

The voltage induced into at least one of these windings is influenced by a factor $\mu AN/(2\pi R)$ also applying to the Rogowski-Steinhaus-Chattock coil, where $\mu$ is the magnetic permeability, A is the cross-sectional area of a correspondingly adaptable winding, N is the number of windings and R is the distance from the current that is to be measured. Furthermore, a plurality of windings with a different cross section can be used for the voltage adaptation. In order to avoid interfering with the sensitivity and frequency behavior of the measuring line, the aforementioned adaptations to provide the necessary voltage are advantageously to be carried out on the windings of the isolating line.

Figure 4:
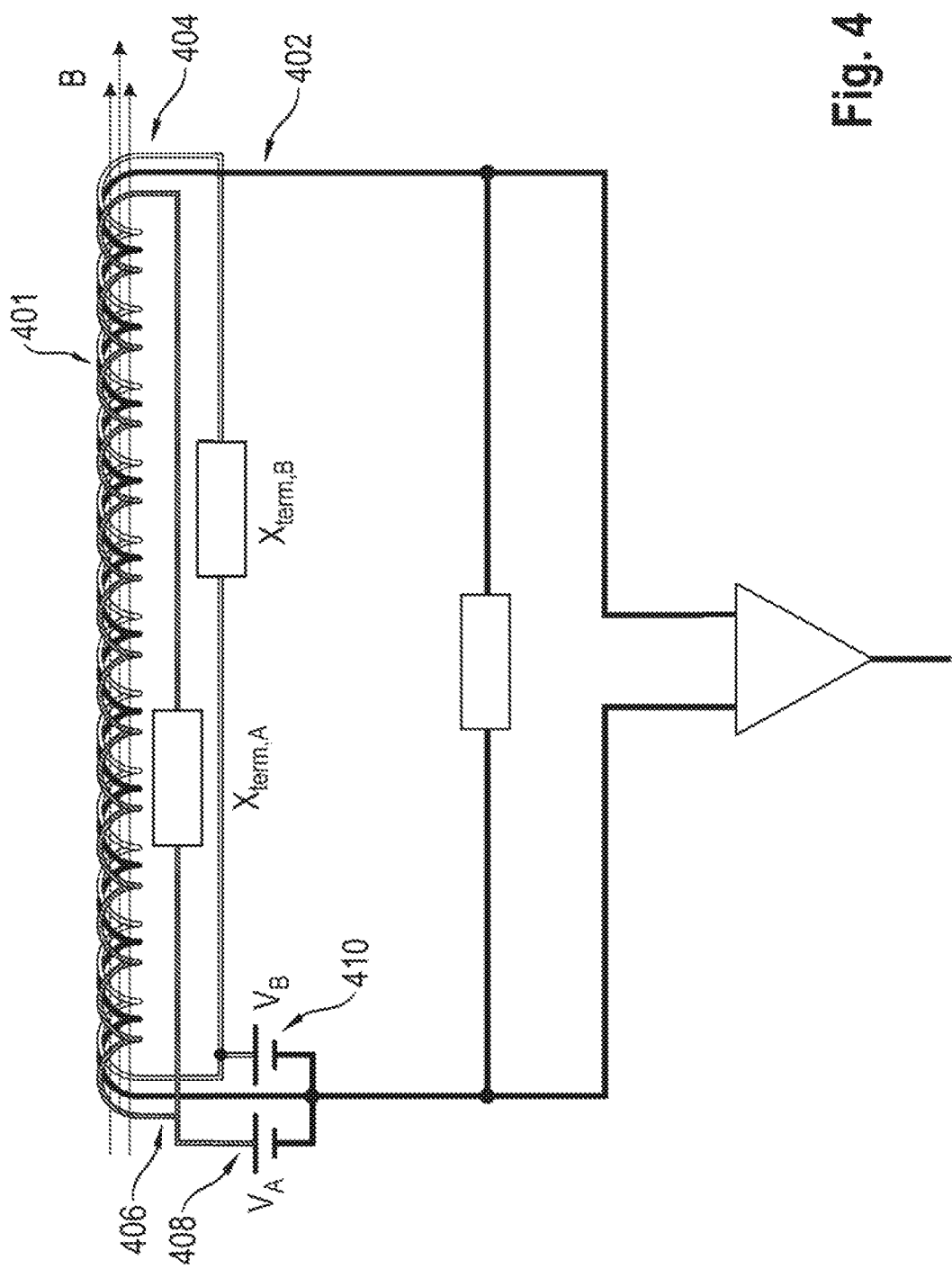
FIG. 4 shows in schematic representation a circuit diagram of a further embodiment for the connection according to aspects of the invention of two isolating lines provided according to aspects of the invention within an embodiment of the Rogowski-Steinhaus-Chattock sensor provided according to aspects of the invention.

FIG. 4 shows use of two isolating lines 404 and 406. The use of at least two isolating lines is particularly advantageous for minimizing a capacitance from winding to winding. These lines are wound into a further provided Rogowski-Steinhaus-Chattock coil 401 so that each winding of a measuring line 402 comprising the Rogowski-Steinhaus-Chattock coil is isolated on one side by an isolating line 404 and on the other side by the other isolating line 406 from the closest winding of the measuring line 402 and 401. Each of the isolating lines 404, 406 is intended to be referenced in terms of its potential against the measuring line 402, for example via voltage sources 408 and 410.

Figure 5:
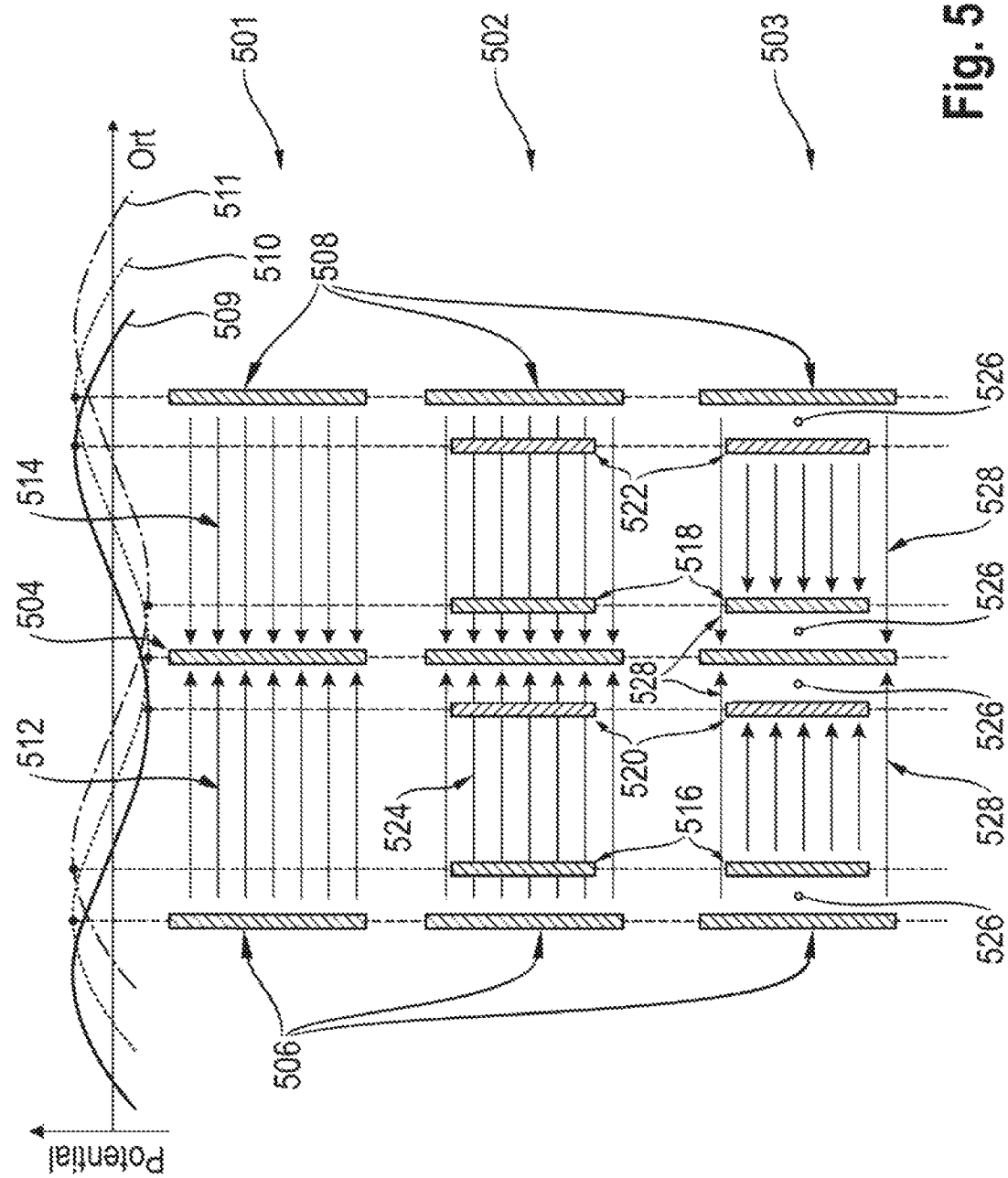
FIG. 5 illustrates in schematic representation a mode of operation of one embodiment of an isolating line provided according to aspects of the invention.

FIG. 5 illustrates schematically the mode of operation of an isolating line in relation to a measuring line using an arrangement of plate capacitors. The extreme case is shown in which a conductor length of a winding corresponds to a half-wavelength of a potential characteristic 510 as a function of the location, as shown in a diagram in the upper area of the figure, and therefore adjacent windings of the measuring line have opposing electric potential.

In the upper arrangement 501, three windings of a measuring line 504, 506, and 508 are shown in idealized form by the section through a plate capacitor disk. Electric fields whose field lines are represented by vector arrows 512 and 514 are set up on the basis of the voltage differences, as shown by the characteristic 510. These field lines also illustrate the coupling.

Windings of two isolating lines are additionally incorporated in the middle arrangement 502. The capacitor plates 516 and 518 represent two windings of a first isolating line, while a further two windings of a second isolating line are represented by the capacitor plates 520 and 522. The vector field 524, which has remained unchanged from the vector field 512 in the upper arrangement 501, shows that the incorporated windings of the isolating line, or the capacitor plates 516, 518, 520 and 522, insofar as they are not brought into a specific potential relationship with the plates 504, 506 and 506 representing the measuring line, do not in general advantageously change the field conditions. The potential characteristic of the isolating lines, and also that of the measuring line, is shown by the curve 510.

In the lower arrangement 503, the isolating lines surrounding the measuring lines, represented by the capacitor plates 516, 518, 520 and 522, are now passively or actively brought onto the potential of the associated measuring line at this point. The potential characteristic of the respective isolating lines as a function of the location is now given by 509 in respect of the capacitor plates 516 and 518, and by 511 in respect of the capacitor plates 520 and 522. The space 526 between the measuring line and isolating line becomes field-free and the coupling ceases to exist. The capacitor plates 504, 506 and 506, shown as slightly longer, of the measuring line are intended to indicate that, with the round windings of the measuring line present in the Rogowski-Steinhaus-Chattock coil, the isolating lines, represented in the lower diagram by the capacitor plates 516, 518, 520 and 522, cannot fully shield the field of the measuring line, but rather field lines 528 run around the shielding lines due to edge effects.

Figure 6:
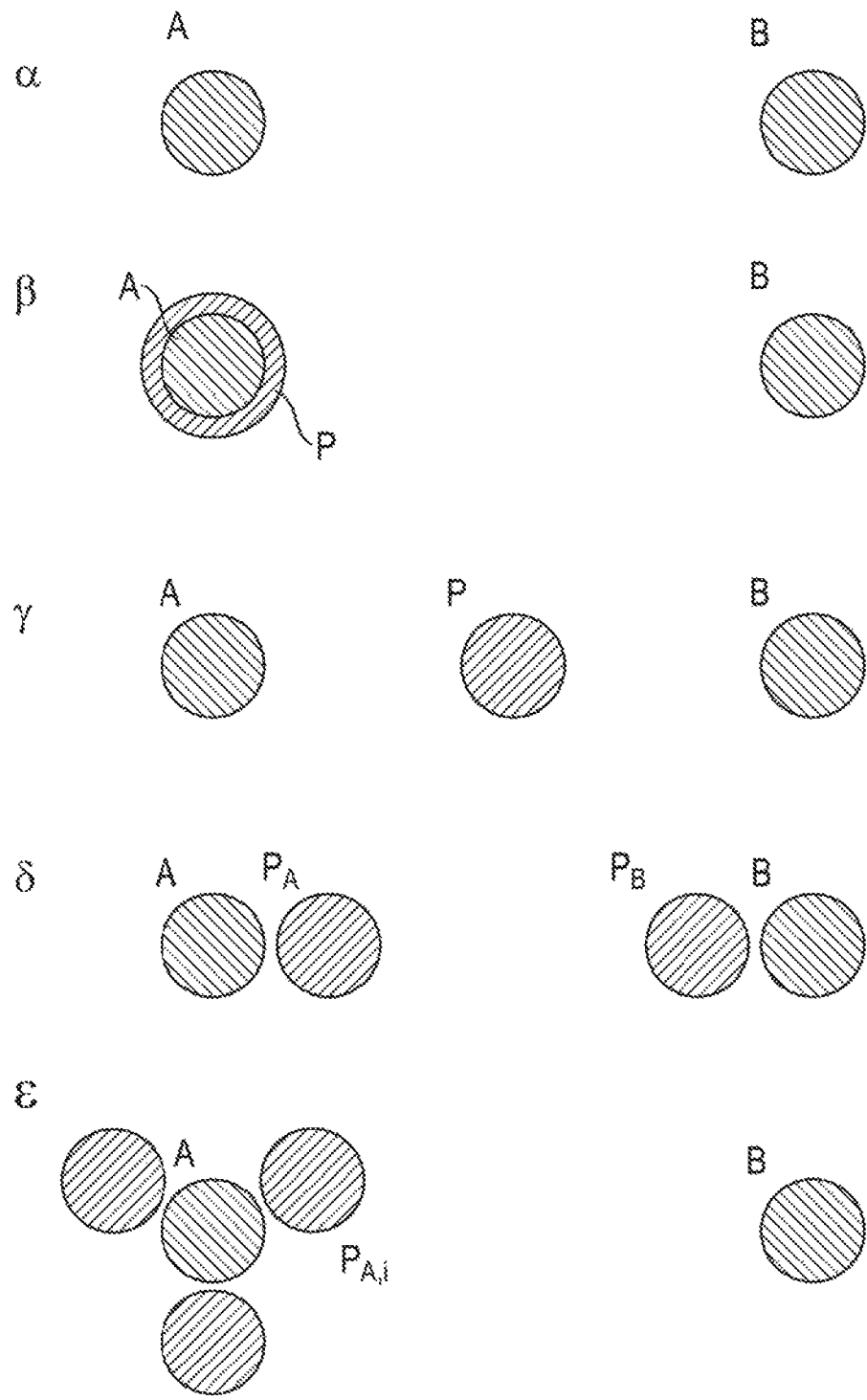
FIG. 6 shows different arrangements of isolating lines provided according to aspects of the invention in relation to correspondingly provided measuring lines.

FIG. 6 shows different arrangements of isolating lines which are intended to shield the measuring lines. A distinction is made here between a (di)electric and a magnetic shielding effect. In the case of the (di)electric shielding effect, the isolating line, as well as reducing the electromagnetic coupling of the measuring line in relation to other lines or in relation to the measuring line's own windings, also acts as a conventional shield against electrical interference radiation, for example of high-frequency interference and waves. In addition, the isolating line can also develop a magnetic shielding effect. However, this is unwanted in most cases. It is therefore an advantage of the method according to aspects of the invention to set the magnetic shielding effect in a targeted manner by means of the two aforementioned parameters, depending on the frequency range. For low-frequency interference with wavelengths far above the measuring line thickness, the shielding effect depends on the terminating impedance of the isolating line. The terminating impedance must be so low that the induced currents can deprive the interference radiation of a substantial part of its energy. Since the measuring effect in the measuring line is also simultaneously based on low-frequency fields of the current that is to be measured, such a magnetic shielding effect of the isolating line is generally unwanted. High-frequency interference with wavelengths in the region of or only a few orders of magnitude higher than the conductor diameter can cause eddy currents in the conductor and thus reduce energy.

A few examples of arrangements of measuring lines A and B, and also shielding lines $P_A$, $P_B$ or $P_{A,P}$ are now shown.

The arrangement α shows the standard with one or more measuring lines, for example designated here by A and B, which are wound on in direct proximity, i.e. with or without gap between the windings.

In arrangement β at least one measuring line, here, for example, the measuring line A, is surrounded by an isolating line P. A more or less great distance may be present between the two lines. The isolating line P ideally has a line impedance (inductance and resistance) very similar to the measuring line A. The implementation may be effected, for example, as a coaxial line. The isolating line may similarly be implemented by a plurality of individual conductors.

Arrangement γ shows the case, already illustrated in FIG. 2, of the isolating line inserted between two windings of a measuring line.

In arrangement δ, two isolating lines $P_A$ and $P_B$ are inserted between two windings of a measuring line (A and B are windings of the same measuring line) or between two measuring lines (A is the winding of one measuring line, B is the winding of another measuring line). Isolating line $P_A$ ($P_B$) isolates its adjacent measuring line A (B) from the closest winding B (A) of the measuring line and its isolating line $P_B$ ($P_A$) (and vice versa).

The isolating lines may also have a shorter distance to the respective measuring lines. Beyond the illustrated case, further isolating lines may also be inserted.

In arrangement ε, the winding of a measuring line A is surrounded by three isolating lines $P_{A,i}$, where i=1,2,3. This can be extended to all windings of the measuring line. More than the three illustrated isolating lines can also be arranged around one measuring line.

Figure 7:
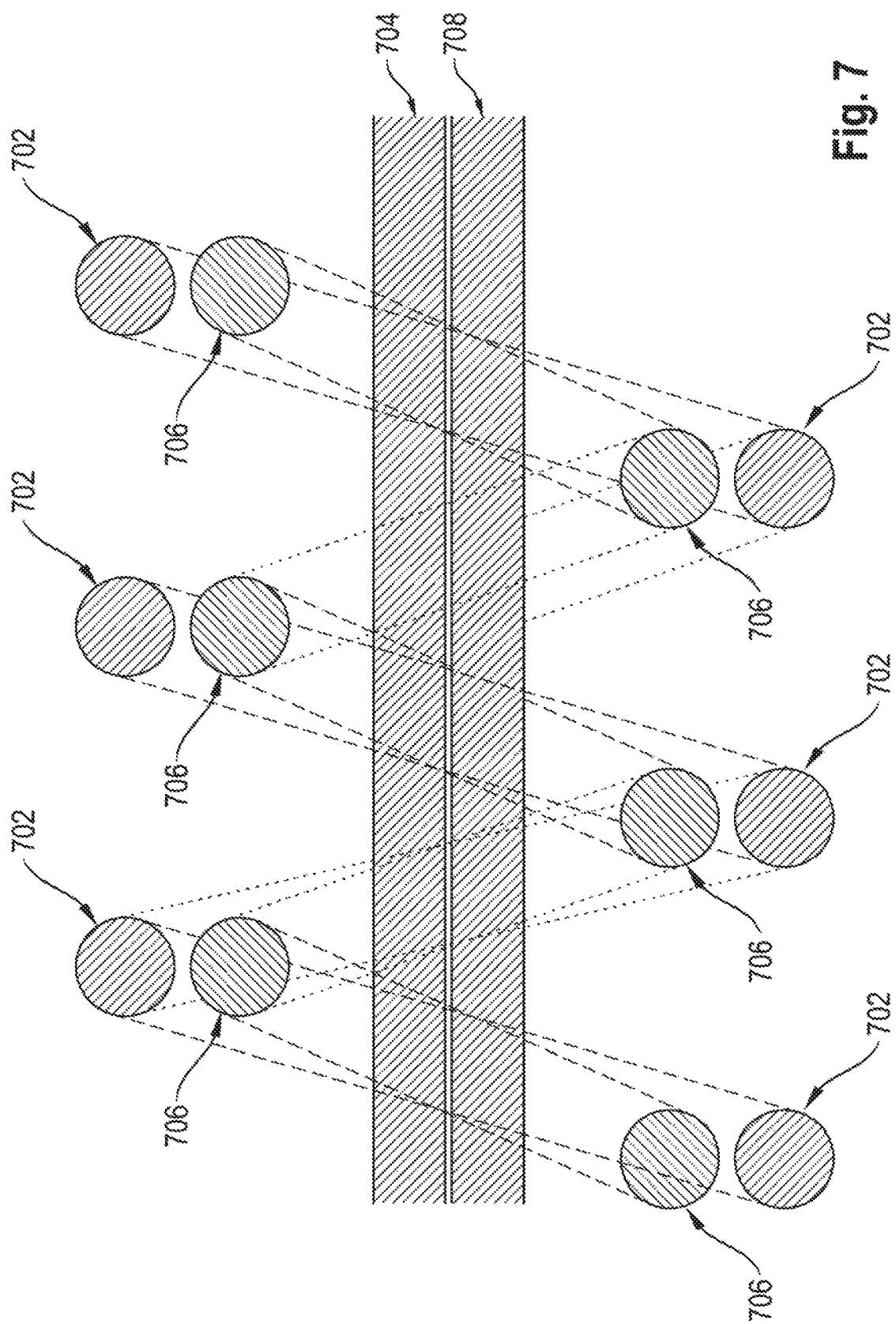
FIG. 7 shows a further possibility for the arrangement of an isolating line provided according to aspects of the invention in relation to a provided measuring line.

FIG. 7 shows an isolation of windings of a measuring line 702 from a return conductor 704 of the measuring line 702 running within the windings. An isolating line 706 is advantageously located with a smaller toroidal cross section in the toroid of the measuring line 702, around the windings of the measuring line 702. The potential of the windings of the isolating line 706 should be selected in such a way that the voltage between a point on the windings of the isolating line 706 and the closest point on the windings of the measuring line 702 becomes infinitesimally small, as far as possible at any time. A return conductor 708 of the isolating line is furthermore shown.

Figure 8:
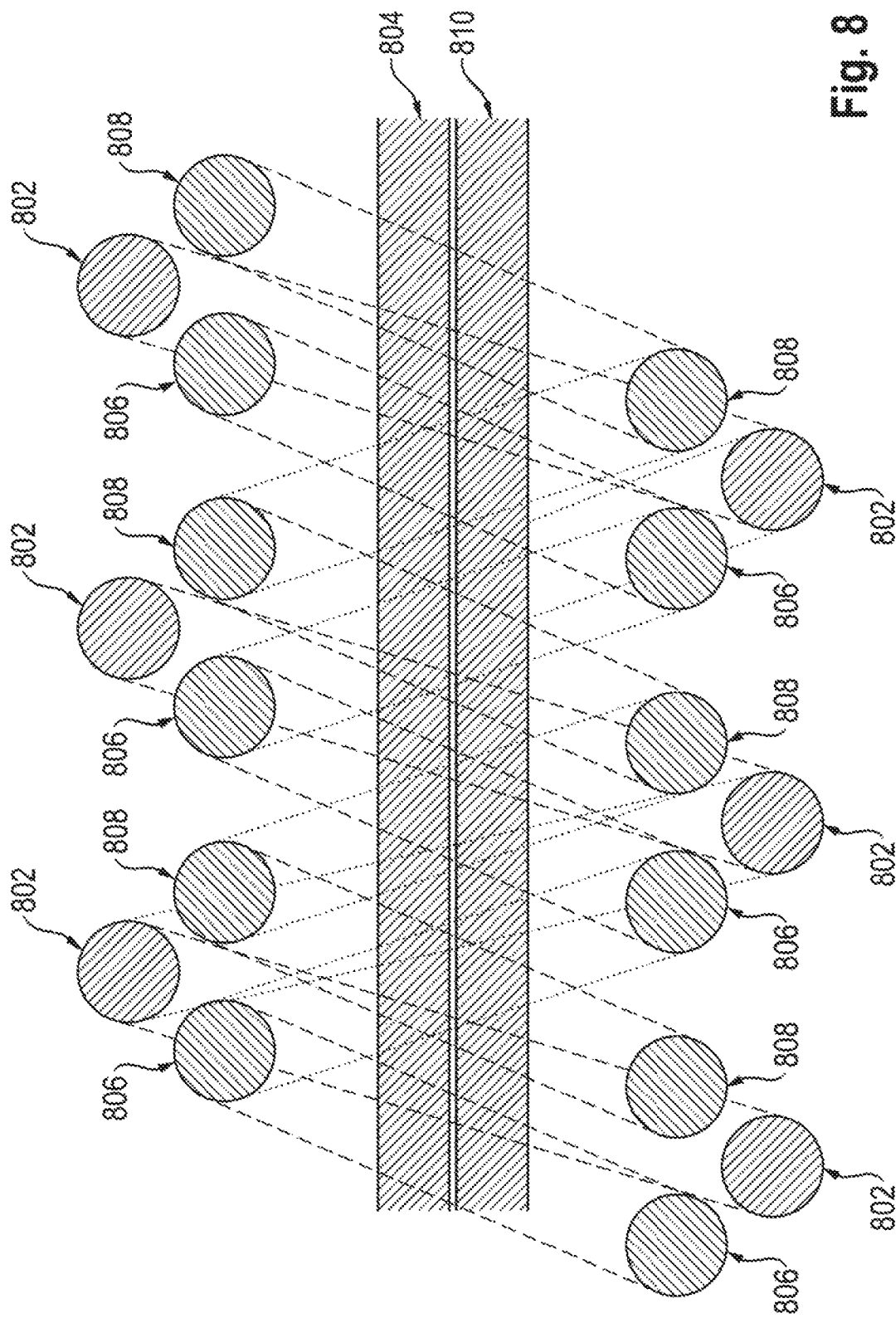
FIG. 8 shows in schematic representation one possible embodiment of an arrangement according to aspects of the invention of a Rogowski-Steinhaus-Chattock coil and isolating lines provided according to aspects of the invention.

As an example of an isolation by a plurality of isolating lines, FIG. 8 shows an isolation of windings of a measuring line 802 from a return conductor 804 by means of two isolating lines 806 and 808. Through the use of more than one isolating line, more field lines between the return conductor 804 and the windings of the measuring line 802 can be isolated and the capacitive, dielectric coupling can be reduced. The return conductor 810 of the isolating lines is also internally-running. The potential of the windings of the isolating lines 806 and 808 should also be selected here in such a way that the voltage between a respective point on the respective windings of the isolating lines 806 and 808 and the closest point on the windings of the measuring line 802 becomes infinitesimally small, as possible at any time.

Figure 9:
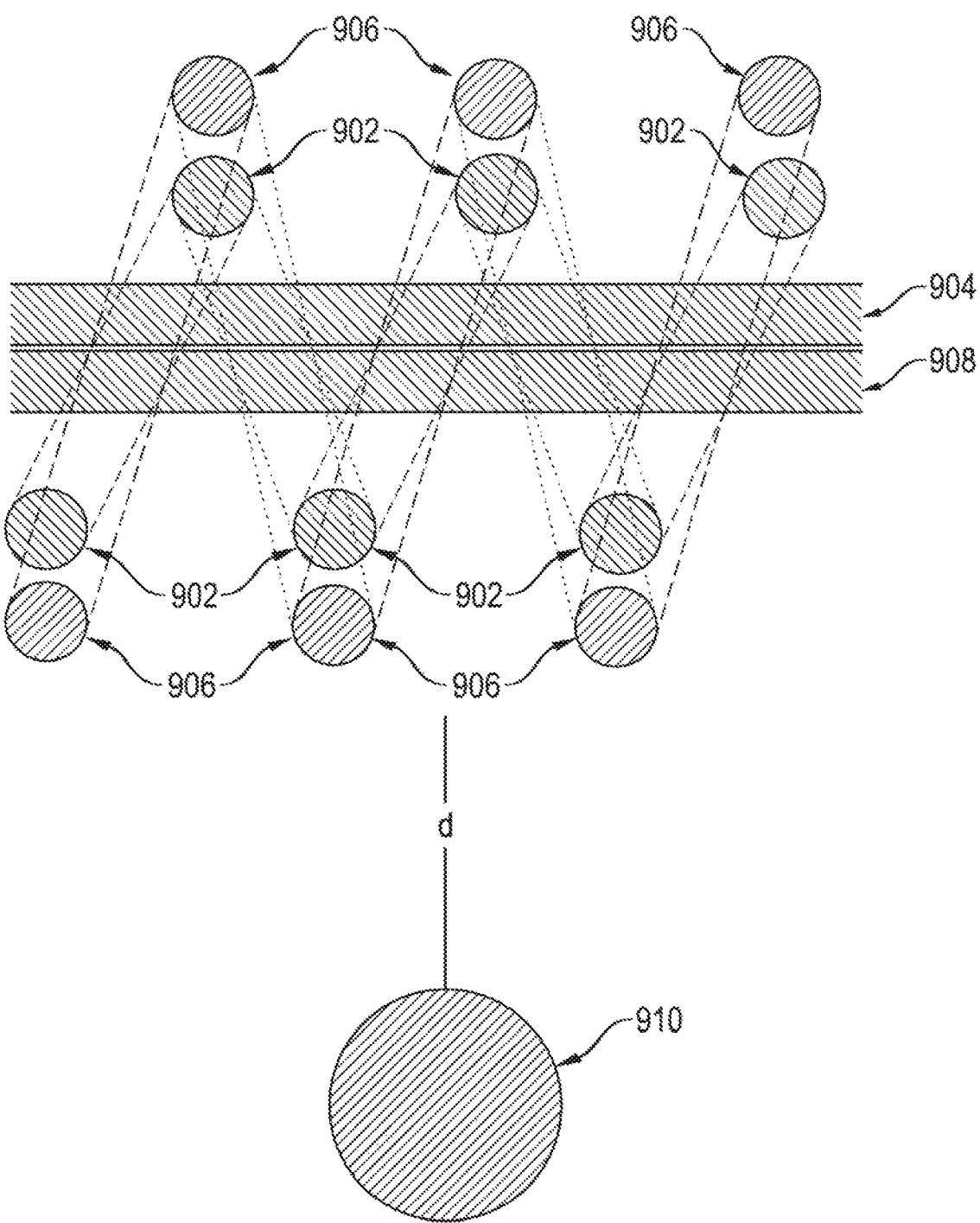
FIG. 9 shows further possible embodiment of an arrangement according to aspects of the invention of a Rogowski-Steinhaus-Chattock coil and an isolating line provided according to aspects of the invention.

FIG. 9 shows schematically the arrangement of a Rogowski-Steinhaus-Chattock coil and an object 910 located at the distance d, which may be the measurement object, an external dielectric interference source or the earth potential (earth). In this case, the winding of an isolating line 906 is advantageously to be provided with a larger toroidal cross section than the toroid of the measuring line 902.

Similar to FIG. 9, FIG. 10 shows the isolation by means of two external isolating lines 1006 and 1008. In addition, further external isolating lines can also be used for the isolation.

Figure 11:
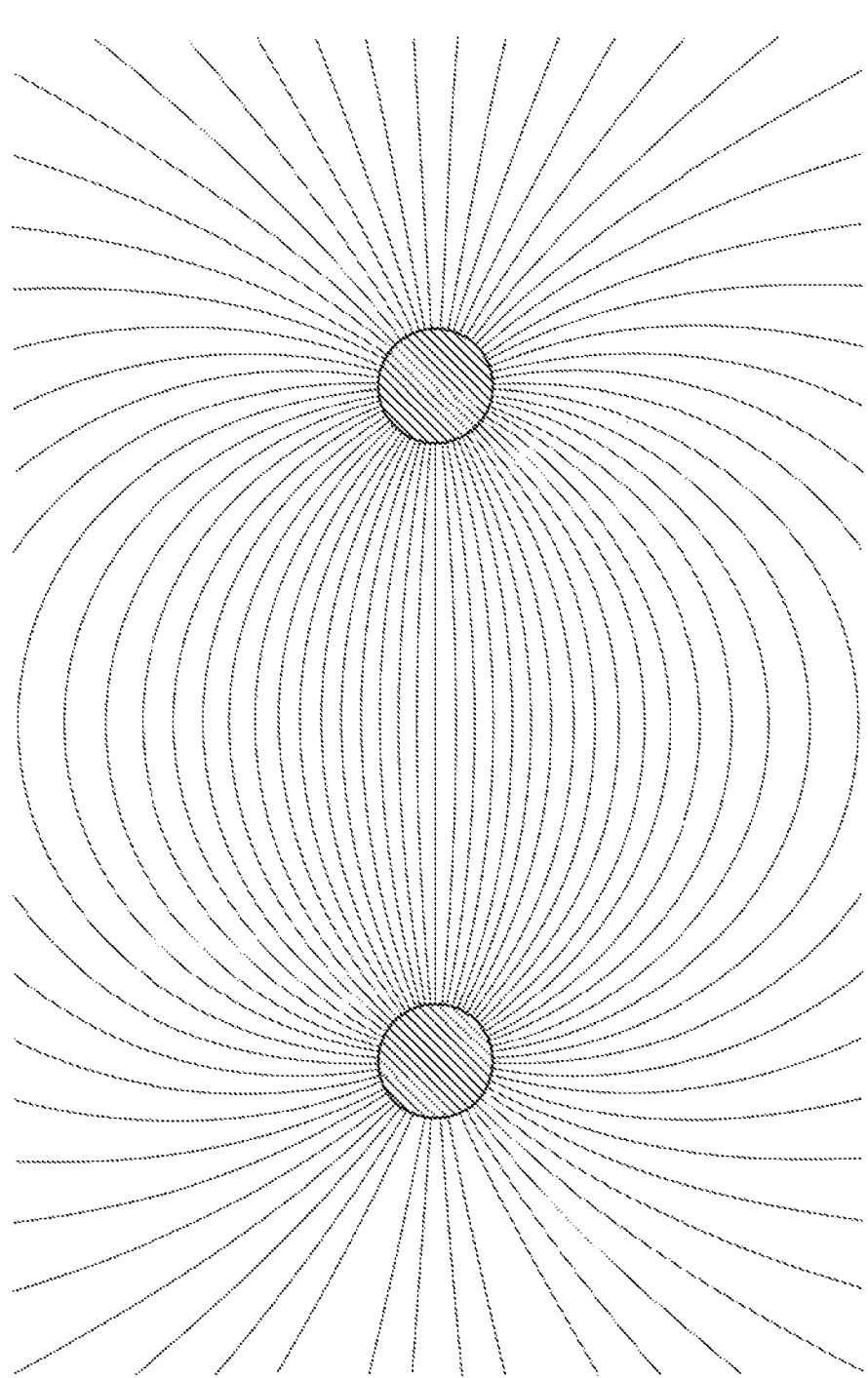
FIG. 11 shows an electric field of two windings of a measuring line on the basis of a finite element simulation.

FIG. 11 shows the electric field of two windings of the measuring line on the basis of a finite element simulation. A line corresponds to an integral curve through the electric field. The density of the lines approximately reflects the field strength.

Figure 12:
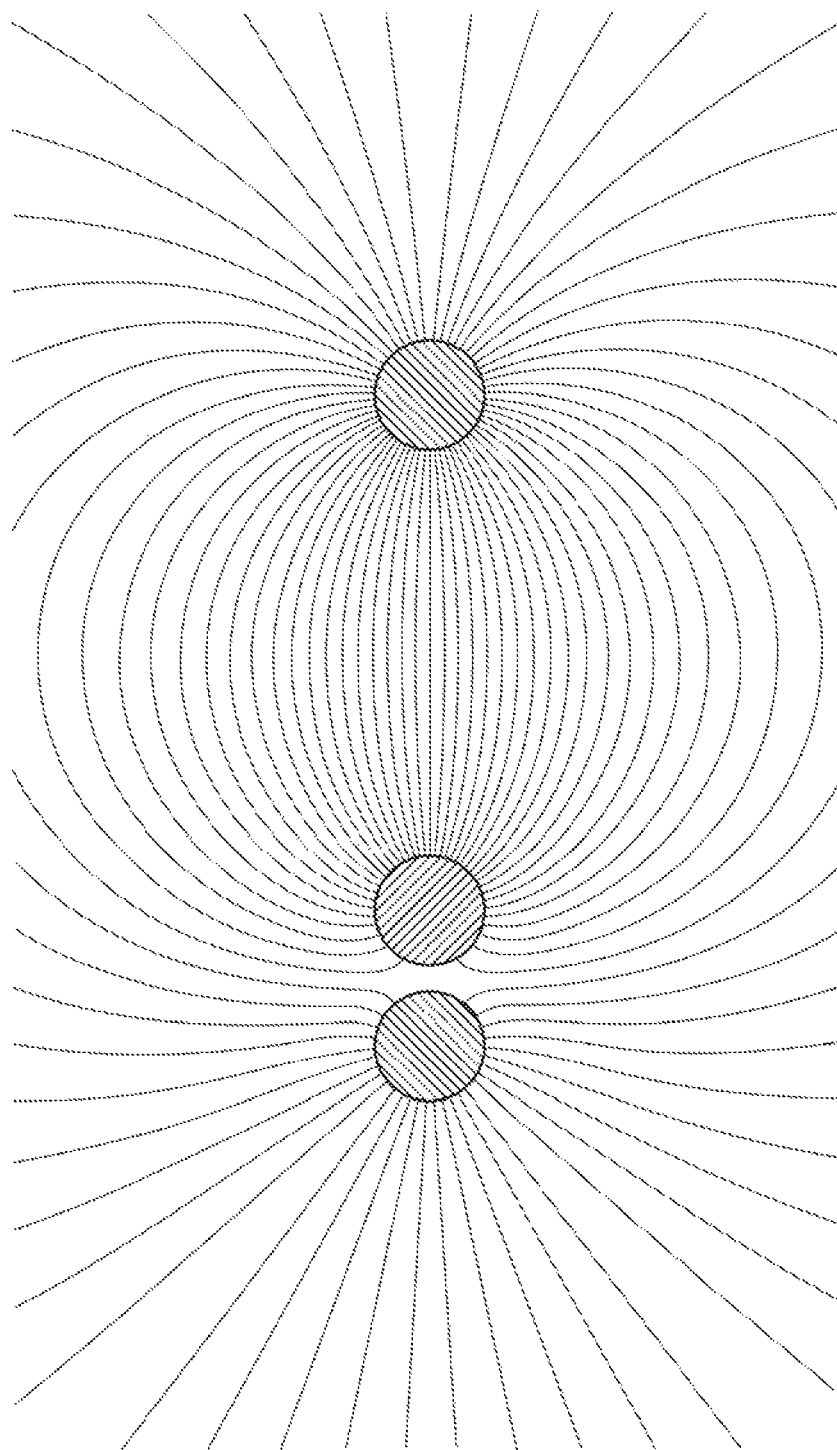
FIG. 12 shows the electric field of two windings of a measuring line and an isolating line on the basis of a finite element simulation.

FIG. 12 shows, on the basis of a finite element simulation, the electric field of two windings of the measuring line and an isolating line which is located close to the left winding of the measuring line. The isolating line has the same potential as the measuring line and carries a predominant part of the electric field and therefore the dielectric coupling to the right winding.

Figure 13:
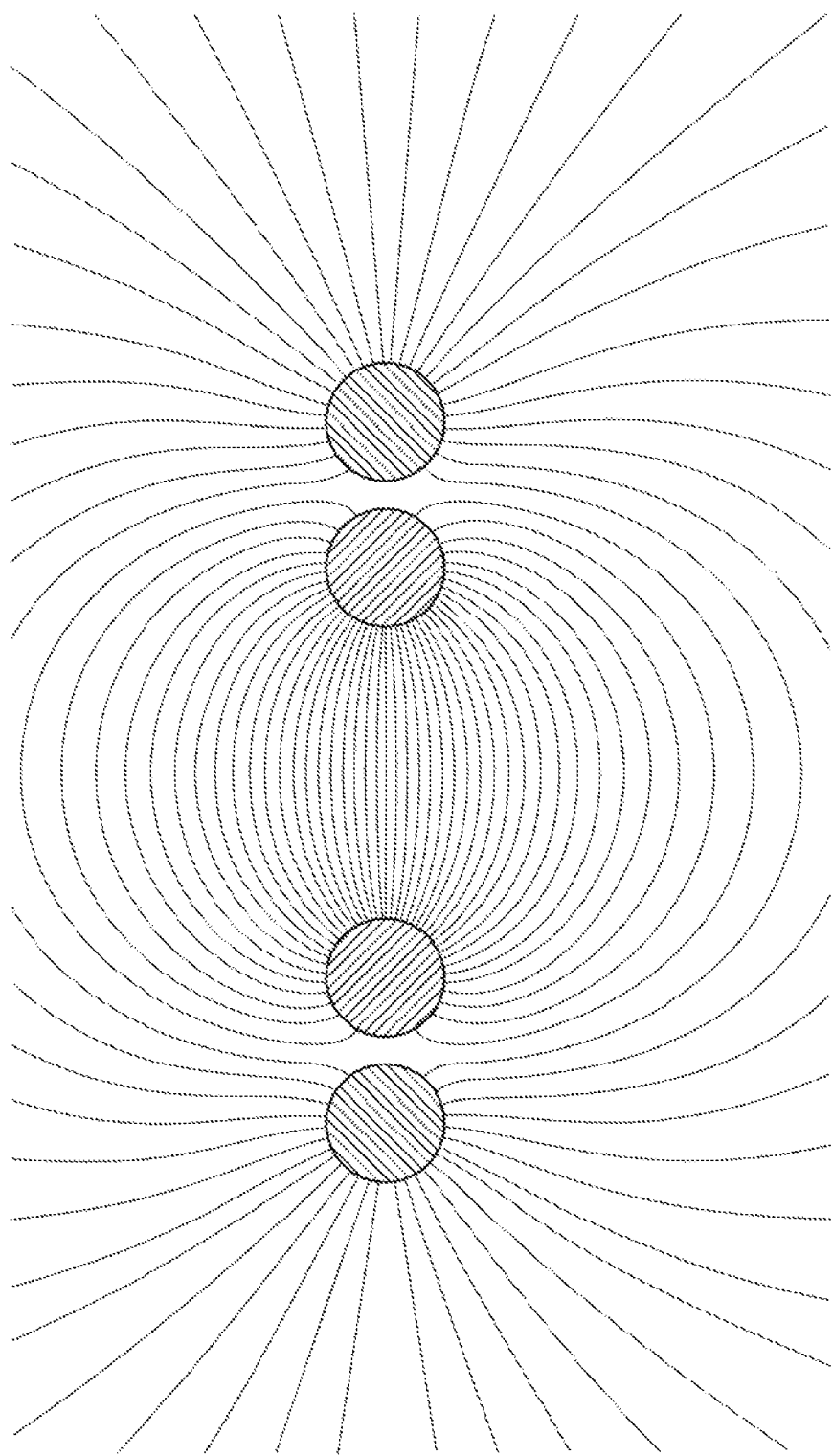
FIG. 13 shows the electric field of two windings of a measuring line and two isolating lines the basis of a finite element simulation.

FIG. 13 shows, on the basis of a finite element simulation, the electric field of two windings of the measuring line and two isolating lines which are located between and in each case close to one of the measuring lines, wherein one isolating line is located close to one of the measuring lines and the other isolating line is located close to the corresponding other measuring line, wherein the isolating lines are in each case at the potential of the associated measuring lines.

Figure 14:
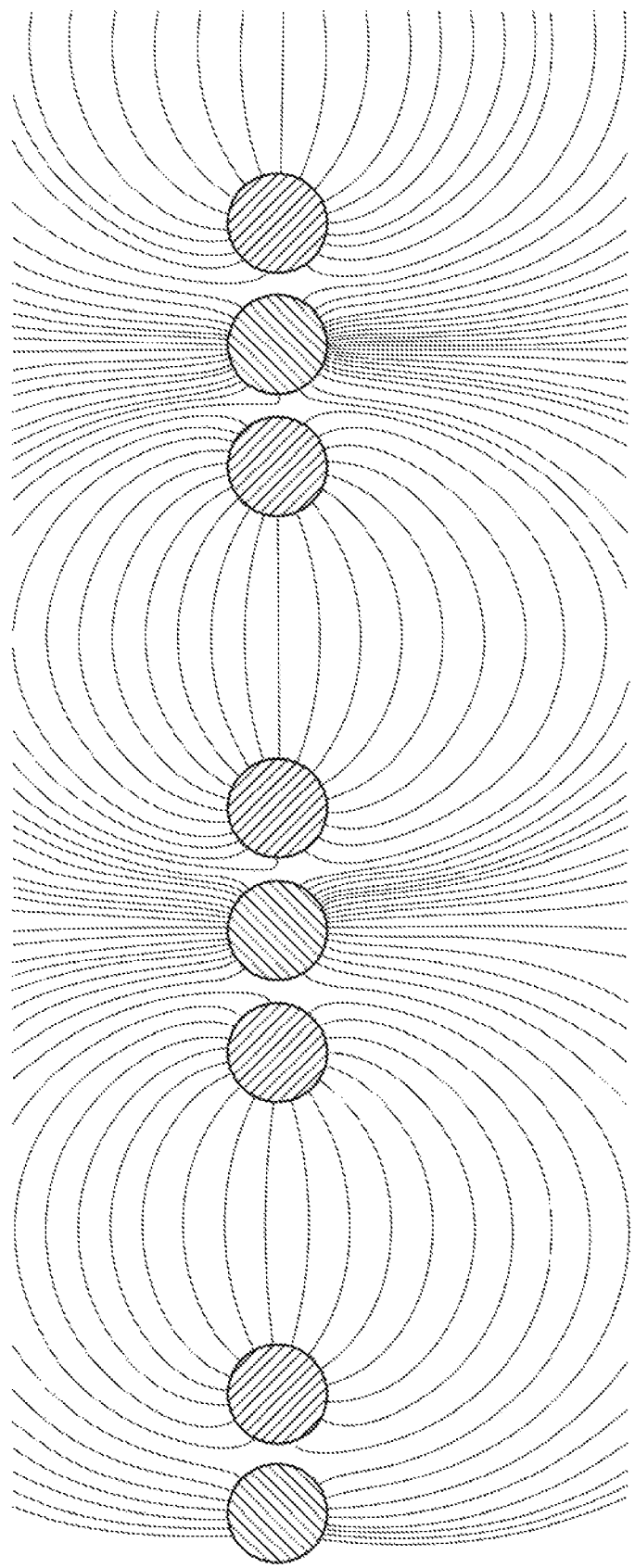
FIG. 14 shows the electric field of a series of windings of a measuring line and a series of windings from two isolating lines on the basis of a finite element simulation.

FIG. 14 shows, on the basis of a finite element simulation, the electric field of a series of windings of the measuring line and a series of windings from two isolating lines which are located close to the left and right side of the respective winding of the measuring line, wherein the isolating lines are in each case at the potential of the associated winding of the measuring line.

Figure 15:
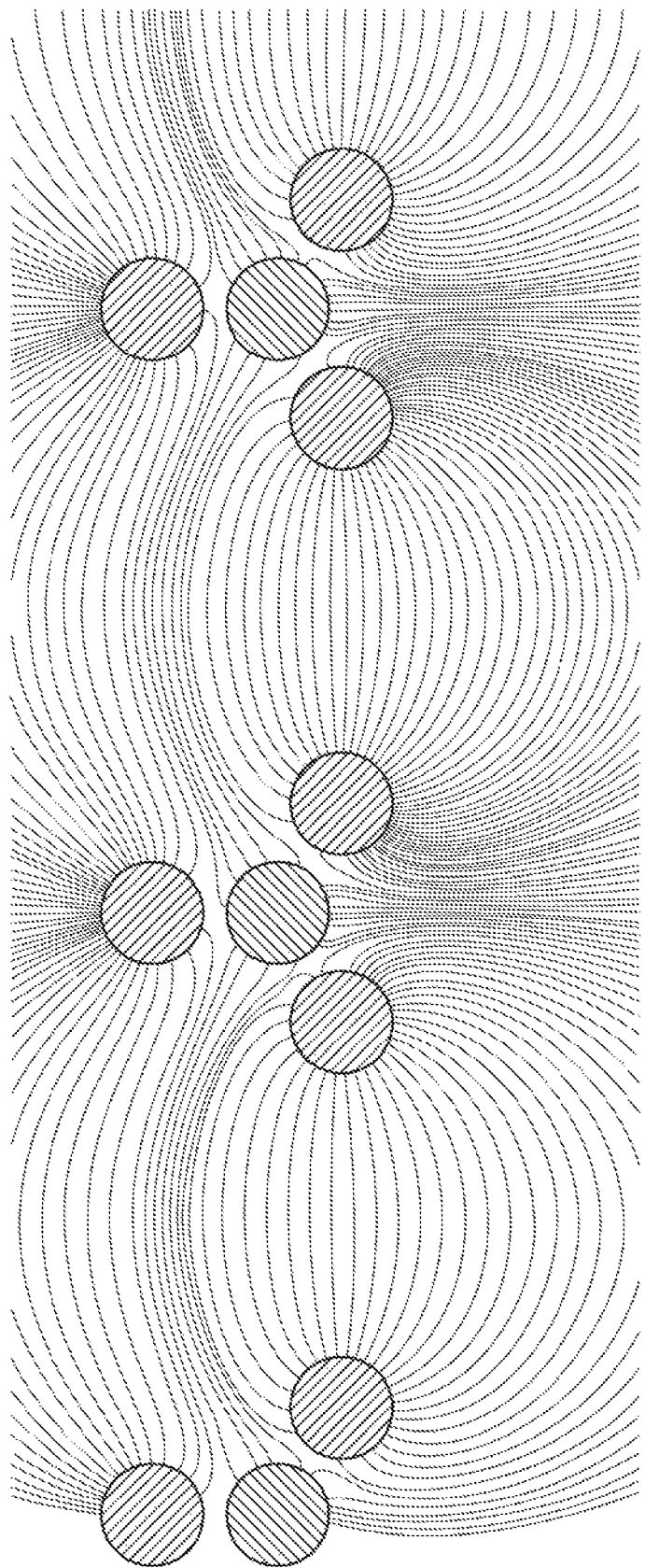
FIG. 15 shows the electric field of a series of windings of a measuring line and a series of windings from three isolating lines on the basis of a finite element simulation.

FIG. 15 shows, on the basis of a finite element simulation, the electric field of a series of windings of the measuring line and a series of windings from three isolating lines which are arranged in a similar manner around each of the windings of the measuring line, wherein the isolating lines are in each case at the potential of the associated winding of the measuring line. Field lines develop which are not shielded and reach on a direct path from one winding of the measuring line to the adjacent winding of the measuring line.

Figure 16:
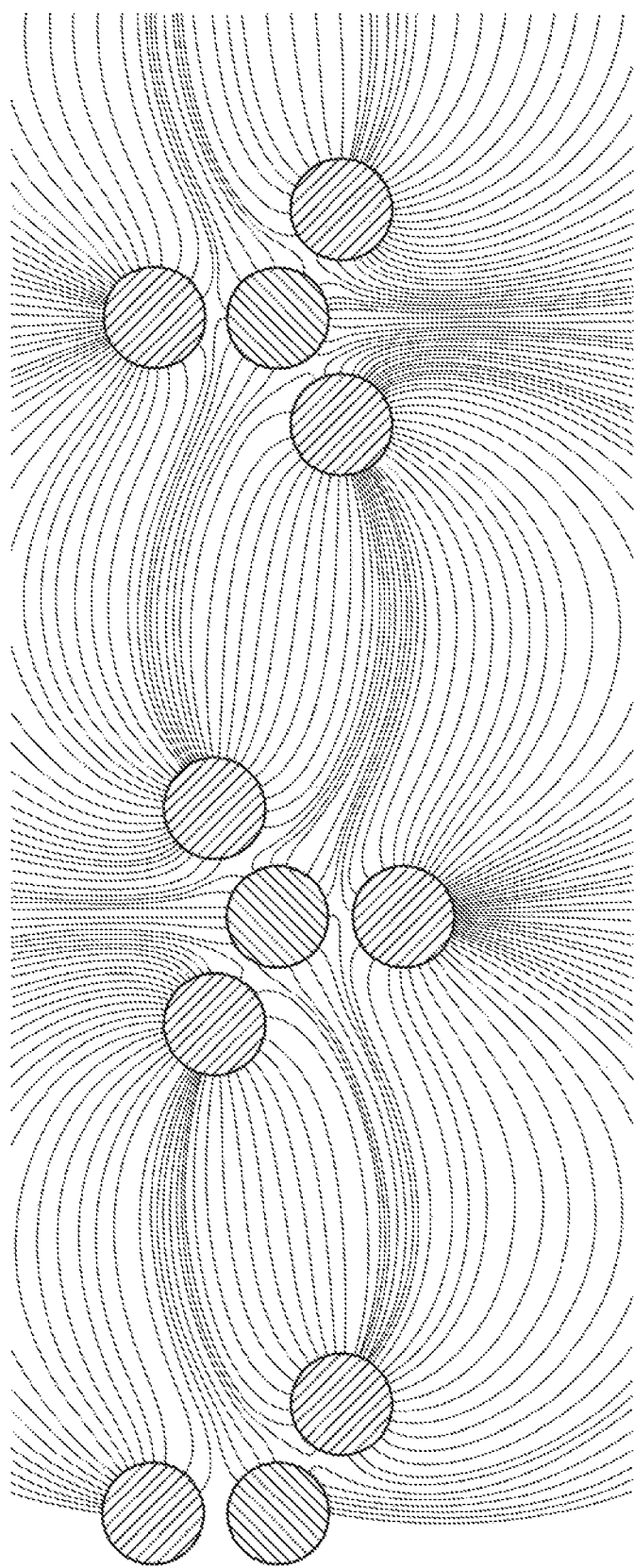
FIG. 16 shows the electric field of a series of windings of a measuring line and a series of windings from three isolating lines on the basis of a finite element simulation.

FIG. 16 shows, on the basis of a finite element simulation, the electric field of a series of windings of the measuring line and a series of windings from three isolating lines which, after passing around a winding, are arranged alternately around the windings of the measuring line, wherein the isolating lines are in each case at the potential of the associated winding of the measuring line. The direct field lines occurring in FIG. 15 between two adjacent windings of the measuring line are thereby advantageously prevented.

What is claimed is:

1. A method for measuring an alternating current flowing through a measurement object, the method comprising:
    aligning Rogowski-Steinhaus-Chattock coil on the measurement object;
    inserting at least one isolating line into coil windings of the Rogowski-Steinhaus-Chattock coil, said at least one isolating line minimizing a capacitive coupling of the coil windings of the Rogowski-Steinhaus-Chattock coil with at least one of one another or at least one further electrical line;
    measuring a voltage induced by the alternating current in at least one measuring line comprising the Rogowski-Steinhaus-Chattock coil; and
    setting with a voltage source, a voltage on the at least one isolating line according to a voltage present on the at least one measuring line.

2. The method as claimed in claim 1, in which the at least one isolating line is exposed to the alternating current in the measurement object.

3. The method as claimed in claim 1, in which the at least one isolating line is connected by a terminal impedance to the Rogowski-Steinhaus-Chattock coil.

4. The method as claimed in claim 1, in which a potential difference between at least one point on the at least one isolating line and a point on the at least one measuring line comprising the Rogowski-Steinhaus-Chattock coil closest to the at least one point on the at least one isolating line is minimized, wherein the at least one isolating line within the Rogowski-Steinhaus-Chattock coil absorbs field lines to at least one dielectrically active object on the measuring line to minimize a capacitive coupling of the Rogowski-Steinhaus-Chattock coil to the at least one dielectrically active object.

5. The method as claimed in claim 4, in which the electric potential of the at least one point on the at least one isolating line is set by an electrical regulating element selected from the group consisting of a potentiometer, an adjustable resistor, or a direct-current source.

6. The method as claimed in claim 4, in which at least one point on the at least one measuring line is short-circuited with at least one point on the at least one isolating line closest to the at least one point on the at least one measuring line.

7. The method as claimed in claim 4,
    wherein the voltage source is connected between at least one point on the at least one measuring line and at least one point on the at least one isolating line that is closest to the at least one point on the at least one measuring line.

8. The method as claimed in claim 7, wherein the voltage source is connected at one end of at least one of the at least one isolating line or the at least one measuring line.

9. The method as claimed in claim 1, in which the at least one isolating line is terminated with the same impedance as the at least one measuring line.

10. The method as claimed in claim 9, in which at least one of at least one terminating resistance or at least one input resistance of an amplifier is selected as the impedance.

11. The method as claimed in claim 1, in which two isolating lines are inserted into the Rogowski-Steinhaus-Chattock coil such that a respective winding of the Rogowski-Steinhaus-Chattock coil is isolated on a first side by a first isolating line and on a second side by a second isolating line from a capacitive interference radiation of an adjacent winding of the Rogowski-Steinhaus-Chattock coil into the respective winding.

12. The method as claimed in claim 11 further comprising:
    setting an electric potential corresponding to an electric potential present on the at least one measuring line on each of the two isolating lines.

13. The method as claimed in claim 12, in which a voltage required to set the electric potential on each of the two isolating lines is generated by a number of windings of at least one isolating line, wherein the number and a cross-sectional area of the windings are selected such that the required voltage is set on the basis of an alternating magnetic field of the alternating current.

14. The method as claimed in claim 1, wherein the voltage source is connected between at least one point on the at least one measuring line and at least one point on the at least one isolating line that is closest to the at least one point on the at least one measuring line.

15. A sensor for measuring an alternating current flowing through a measurement object, wherein the sensor comprises:
    at least one measuring device;
    at least one isolating line;
    at least one measuring line comprising a Rogowski-Steinhaus-Chattock coil, wherein the at least one isolating line is inserted into coil windings of the Rogowski-Steinhaus-Chattock coil to minimize capacitive coupling of at least one of the coil windings with one another or to at least one further electrical line is to be minimized; and a voltage source for setting a voltage on the at least one isolating line according to a voltage present on the at least one measuring line.

16. The sensor as claimed in claim 15, wherein the at least one measuring line, together with the at least one isolating line, forms a coaxial line.

17. The sensor as claimed in claim 15, wherein the at least one isolating line is inserted in each case between two windings of the Rogowski-Steinhaus-Chattock coil.

18. The sensor as claimed in claim 15, wherein the at least one isolating line has a smaller different toroidal cross section than the Rogowski-Steinhaus-Chattock coil.

19. The sensor as claimed in claim 15, wherein the at least one isolating line is routed around the Rogowski-Steinhaus-Chattock coil on a side opposite an inside of the Rogowski-Steinhaus-Chattock coil.

20. The sensor as claimed in claim 15, wherein the at least one isolating line is routed around the Rogowski-Steinhaus-Chattock coil on a side facing an inside of the Rogowski-Steinhaus-Chattock coil.

21. The sensor as claimed in claim 15, which is configured for:
- alignment of the Rogowski-Steinhaus-Chattock coil on the measurement object;
- insertion of at least one isolating line into coil windings of the Rogowski-Steinhaus-Chattock coil, said at least one isolating line minimizing a capacitive coupling of the coil windings of the Rogowski-Steinhaus-Chattock coil with at least one of one another or at least one further electrical line; and
- measurement of a voltage induced by the alternating current in at least one measuring line comprising the Rogowski-Steinhaus-Chattock coil.

22. A method for providing a sensor according to claim 15, in which the at least one isolating line is inserted into the coil windings of the Rogowski-Steinhaus-Chattock coil, said at least one isolating line minimizing a capacitive coupling of the coil windings of the Rogowski-Steinhaus-Chattock coil with at least one of one another or at least one further electrical line.

* * * * *